(12) United States Patent
Lockard et al.

(10) Patent No.: US 7,501,328 B2
(45) Date of Patent: Mar. 10, 2009

(54) METHODS FOR ELECTROCHEMICALLY FABRICATING STRUCTURES USING ADHERED MASKS, INCORPORATING DIELECTRIC SHEETS, AND/OR SEED LAYERS THAT ARE PARTIALLY REMOVED VIA PLANARIZATION

(75) Inventors: Michael S. Lockard, Lake Elizabeth, CA (US); Dennis R. Smalley, Newhall, CA (US); Willa M. Larsen, Reseda, CA (US); Richard T. Chen, Burbank, CA (US)

(73) Assignee: Microfabrica Inc., Van Nuys, CA (US)

( * ) Notice: Subject to any disclaimer, the term of this patent is extended or adjusted under 35 U.S.C. 154(b) by 519 days.

(21) Appl. No.: 11/139,262

(22) Filed: May 26, 2005

(65) Prior Publication Data

US 2006/0011486 A1 Jan. 19, 2006

Related U.S. Application Data

(63) Continuation-in-part of application No. 10/841,383, filed on May 7, 2004, now Pat. No. 7,195,989.

(60) Provisional application No. 60/574,733, filed on May 26, 2004, provisional application No. 60/533,891, filed on Dec. 31, 2003, provisional application No. 60/468,979, filed on May 7, 2003, provisional application No. 60/469,053, filed on May 7, 2003.

(51) Int. Cl.
*H01L 21/326* (2006.01)
*H01L 21/479* (2006.01)

(52) U.S. Cl. ........................................ 438/466; 438/652
(58) Field of Classification Search ................. 438/466, 438/469, 652, 666
See application file for complete search history.

(56) References Cited

U.S. PATENT DOCUMENTS

| 2003/0121791 A1* | 7/2003 | Cohen ........................... 205/93 |
| 2003/0183008 A1* | 10/2003 | Bang et al. ............... 73/514.01 |

\* cited by examiner

*Primary Examiner*—Fernando L Toledo
(74) *Attorney, Agent, or Firm*—Dennis R. Smalley

(57) ABSTRACT

Embodiments of the present invention provide mesoscale or microscale three-dimensional structures (e.g. components, device, and the like). Embodiments relate to one or more of (1) the formation of such structures which incorporate sheets of dielectric material and/or wherein seed layer material used to allow electrodeposition over dielectric material is removed via planarization operations; (2) the formation of such structures wherein masks used for at least some selective patterning operations are obtained through transfer plating of masking material to a surface of a substrate or previously formed layer, and/or (3) the formation of such structures wherein masks used for forming at least portions of some layers are patterned on the build surface directly from data representing the mask configuration, e.g. in some embodiments mask patterning is achieved by selectively dispensing material via a computer controlled inkjet nozzle or array or via a computer controlled extrusion device.

3 Claims, 24 Drawing Sheets

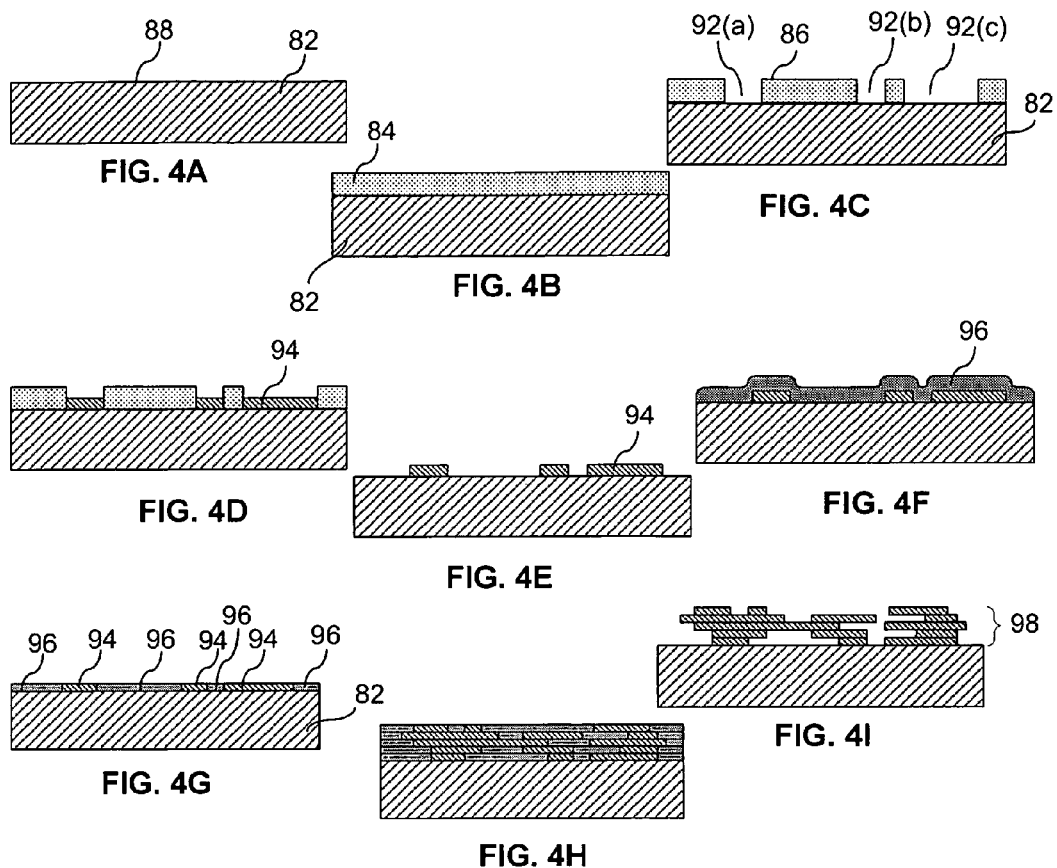
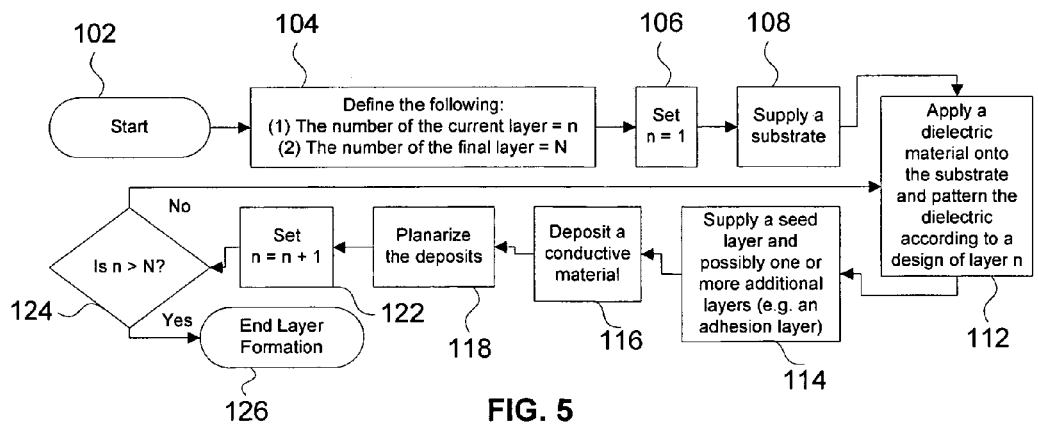

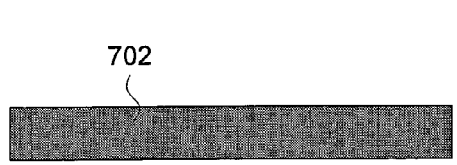
FIG. 13A
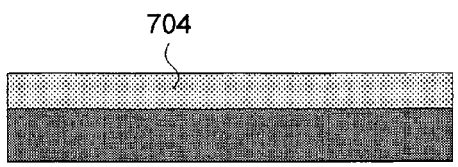
FIG. 13B
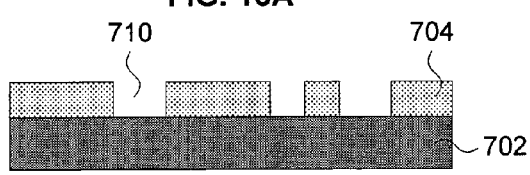
FIG. 13C
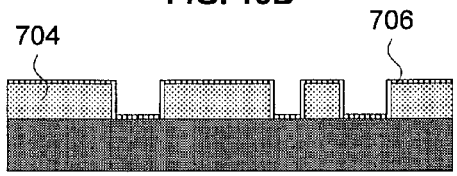
FIG. 13D
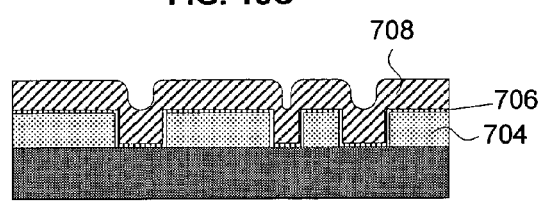
FIG. 13E
FIG. 13F
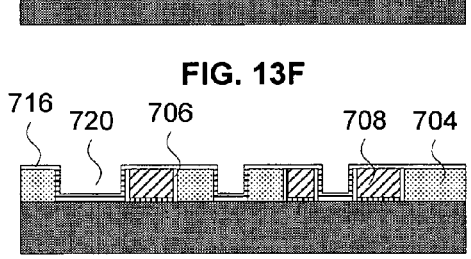
FIG. 13G
FIG. 13H
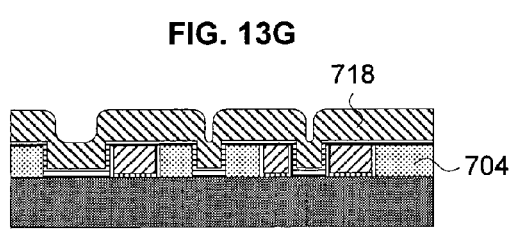
FIG. 13I
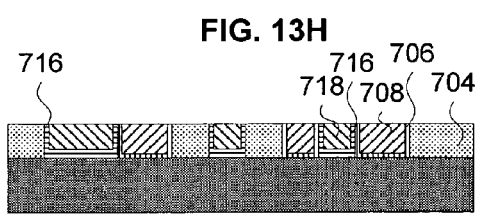
FIG. 13J
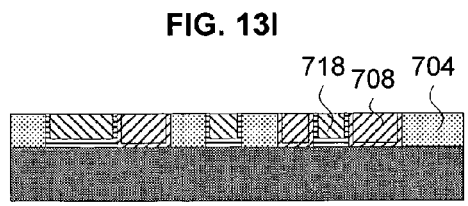
FIG. 13K
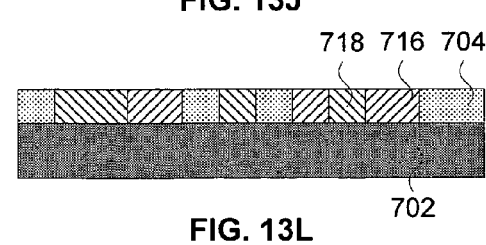
FIG. 13L

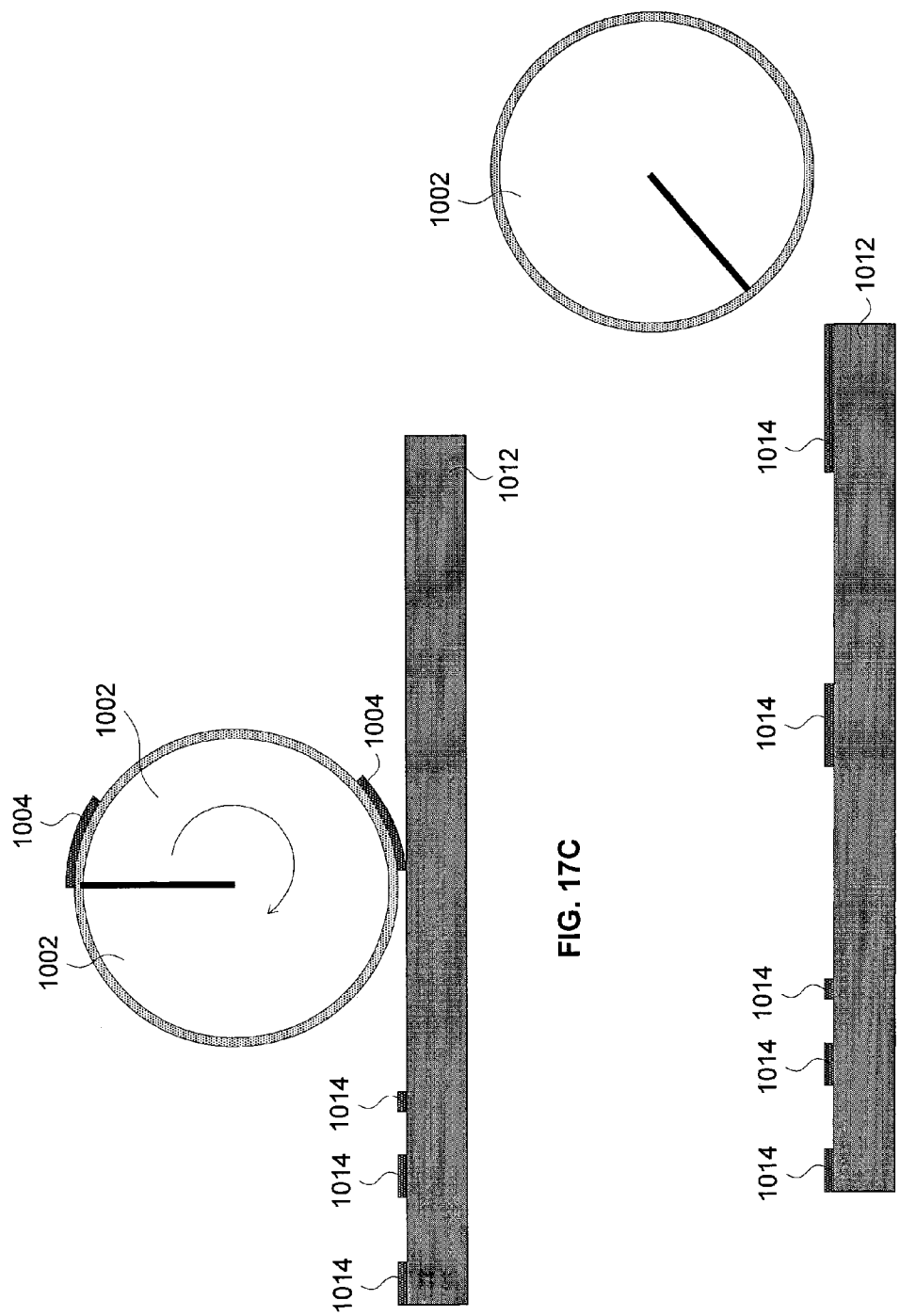

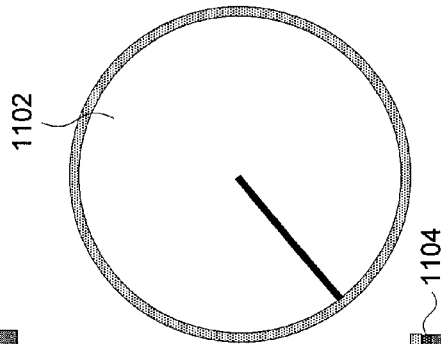
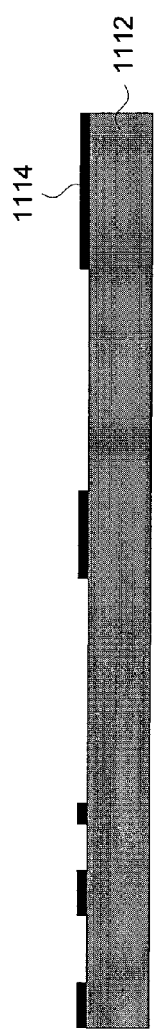
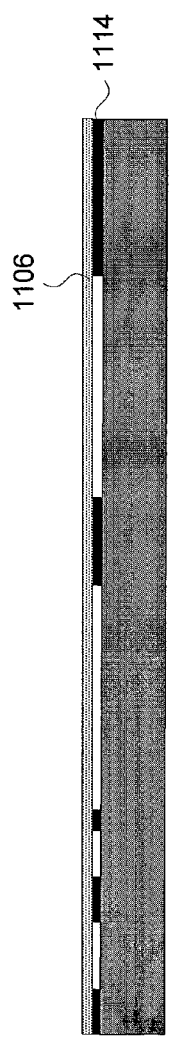
FIG. 18E
FIG. 18D
FIG. 18C

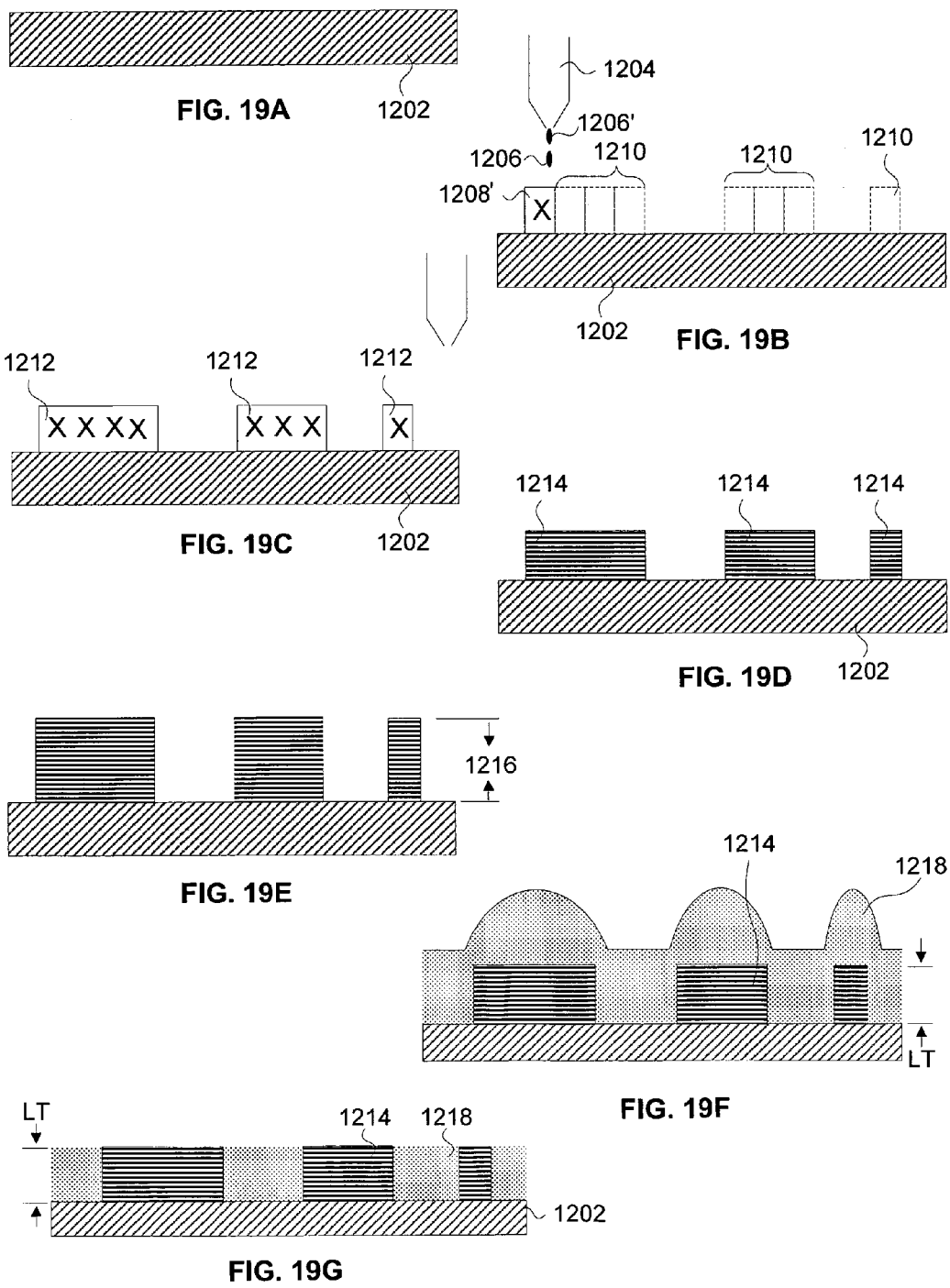

METHODS FOR ELECTROCHEMICALLY FABRICATING STRUCTURES USING ADHERED MASKS, INCORPORATING DIELECTRIC SHEETS, AND/OR SEED LAYERS THAT ARE PARTIALLY REMOVED VIA PLANARIZATION

RELATED APPLICATIONS

This application claims benefit of U.S. Provisional Patent Application No. 60/574,733, filed May 26, 2004 and is a CIP of U.S. patent application Ser. No. 10/841,383, filed May 7, 2004 now U.S. Pat. No. 7,195,989 which in turn claims benefit of the following U.S. Provisional Patent Applications 60/468,979, filed May 7, 2003; 60/469,053, filed May 7, 2003; and 60/533,891, filed Dec. 31, 2003. Each of these applications is hereby incorporated herein by reference as if set forth in full herein.

FIELD OF THE INVENTION

The present invention relates generally to the field of electrochemical fabrication and the associated formation of three-dimensional structures (e.g. microscale or mesoscale structures). In particular, it relates to one or more of (1) the formation of such structures which incorporate sheets of dielectric material and/or wherein seed layer material used to allow electrodeposition over dielectric material is removed via planarization operations; (2) the formation of such structures wherein masks used for at least some selective patterning operations are obtained through transfer plating of masking material or precursor material to a surface of a substrate or previously formed layer, and/or (3) the formation of such structures wherein masks used for at least portions of some layers are patterned on the build surface directly from data representing the mask configuration, e.g. in some embodiments mask patterning is achieved by selectively dispensing material, for example, via a computer controlled inkjet nozzle, ink jet array, or a computer controlled extrusion device.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKING™ or INSTANT MASK plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST '99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-EI-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable, or deformable, (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

The '630 patent also teaches that other methods may be used to form contact masks (i.e. electroplating articles in the language of the '630 patent) which include applying masking composition selectively to a support by such processes as screen printing, stencil printing and inkjet printing.

The '630 patent also teaches that methods similar to those used in relief printing can also be used to fabricate electroplating articles (i.e. contact masks). A cited example of such a method includes: applying a liquid masking composition to a relief pattern which might be produced by patterning a high aspect ratio photoresist such as AZ4620 or SU-8; pressing the relief pattern/masking composition structure against a support such that the masking composition adheres to the support; and removing the relief pattern. The formed electroplating article includes a support having a mask patterned with the inverse pattern of the relief pattern.

The '630 patent additionally teaches the creation of an electroplating article (i.e. a contact mask) by creating a relief pattern on a support by etching of the support, or applying a durable photoresist, e.g., SU-8; coating a flat, smooth sheet with a thin, uniform layer of liquid masking composition; stamping the support/resist against the coated sheet (i.e., like a stamp and inkpad) to quickly mate and unmate the support/resist and the masking composition (preferably the support and the sheet are kept parallel); and curing the liquid masking composition.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structures utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial sacrificial layer of material on the substrate so that the structure and substrate may be detached if desired. In such cases after formation of the structure the plating base may be patterned and removed from around the structure and then the sacrificial layer under the plating base may be dissolved to free the structure. Substrate materials mentioned in the '637 patent include silicon, glass, metals, and silicon with protected processed semiconductor devices. A specific example of a plating base includes about 150 angstroms of titanium and about 300 angstroms of nickel, both of which are sputtered at a temperature of 160° C. In another example it is indicated that the plating base may consist of 150 angstroms of titanium and 150 angstroms of nickel where both are applied by sputtering.

Even though electrochemical fabrication as taught and practiced to date, has greatly enhanced the capabilities of microfabrication, and in particular added greatly to the number of metal layers that can be incorporated into a structure and to the speed and simplicity in which such structures can be made, room for enhancing the state of electrochemical fabrication exists. In particular, a need exists for improved methods of forming adhered masks for selectively patterning substrates or previously formed layers or portions of layers and/or for incorporating structural dielectric materials into electrochemically fabricated structures. A need also exists for improved methods of applying and/or removing seed layer material and possibly adhesion layer material that may be used in allowing electrodeposition to occur over non-conductive portions of previous layers.

SUMMARY OF THE INVENTION

It is an object of some aspects of the invention to provide improved methods for forming adhered masks.

It is an object of some aspects of the invention to provide an improved electrochemical fabrication technique that includes the use of a tool for transferring masking material to substrates, or previously formed layers.

It is an object of some aspects of the invention to provide an improved electrochemical fabrication technique that includes the direct patterning of masking material onto substrates and/or previously formed layers.

It is an object of some aspects of the invention to provide an improved electrochemical fabrication technique capable of incorporating a structural dielectric material.

It is an object of some aspects of the invention to provide an improved electrochemical fabrication technique capable of incorporating a structural dielectric material in sheet form.

It is an object of some aspects of the invention to provide an improved electrochemical fabrication technique that incorporates structural dielectric materials and which removes selected portions of seed layer material, and possibly adhesion layer material, without need for etching operations.

It is an object of some aspects of the invention to provide an improved electrochemical fabrication technique that incorporates structural dielectric materials and which removes selected portions of seed layer material, and possibly adhesion layer material, using trimming or planarization operations.

It is an object of some aspects of the invention to provide an improved electrochemical fabrication technique that incorporates structural dielectric materials by depositing them over previously formed layers and over one or more materials deposited in association with formation of a current layer.

Other objects and advantages of various aspects of the invention will be apparent to those of skill in the art upon review of the teachings herein. The various aspects of the invention, set forth explicitly herein or otherwise ascertained from the teachings herein, may address one or more of the above objects alone or in combination, or alternatively they may address some other object of the invention that may be ascertained from the teachings herein. It is not intended that all objects be addressed by any single aspect of the invention even though that may be the case with regard to some aspects.

In a first aspect of the invention a process for forming a multilayer three-dimensional structure includes: (a) forming and adhering a layer of material to a substrate, wherein the substrate may include previously formed layers; and (b) repeating the forming and adhering operation of (a) a plurality of times to build up a three-dimensional structure from a plurality of adhered layers; wherein the formation of at least one layer comprises: (i) forming a desired pattern of dielectric material on the substrate or on previously deposited material wherein the patterning of the dielectric results in at least one void in the dielectric material that exposes a portion of the substrate or previously deposited material; (ii) applying a seed layer material to the dielectric material and to the exposed portions of the substrate or previously deposited material; (iii) depositing a conductive material into the at least one void in the dielectric; and (iv) after depositing the conductive material, removing at least a portion of the seed layer material located on the dielectric material.

In a second aspect of the invention a process for forming a multilayer three-dimensional structure includes: (a) forming and adhering a layer of material to a substrate, wherein the substrate may include previously formed layers; and (b) repeating the forming and adhering operation of (a) a plurality of times to build up a three-dimensional structure from a plurality of adhered layers; wherein the formation of at least one layer comprises: (i) forming a desired pattern of a first material on the substrate or on previously deposited material wherein the patterning of the first material results in at least one void in the first material that exposes a portion of the substrate or previously deposited material; (ii) applying a seed layer material to the first material and to the exposed portions of the substrate or previously deposited material; (iii) depositing a first conductive material into the at least one void in the first material; and (iv) after depositing the first conductive material, removing at least a portion of the seed layer material located on the first material.

In a third aspect of the invention a process for forming a multilayer three-dimensional structure includes: (a) forming and adhering a layer of material to a substrate, wherein the substrate may include previously formed layers; and (b) repeating the forming and adhering operation of (a) a plurality of times to build up a three-dimensional structure from a plurality of adhered layers; wherein the formation of at least one layer comprises: (i) forming a desired pattern of dielectric material on the substrate or on previously deposited material; and thereafter performing at least one of the following: (1) depositing a structural conductive material; (2) depositing a sacrificial conductive material; or (3) depositing a seed layer.

In a fourth aspect of the invention a process for forming a multilayer three-dimensional structure includes: (a) forming and adhering a layer of material to a substrate, wherein the substrate may include previously formed layers; and (b) repeating the forming and adhering operation of (a) a plurality of times to build up a three-dimensional structure from a plurality of adhered layers; wherein the formation of at least one layer comprises: (i) forming a desired pattern of a first material on the substrate or on previously deposited material; and thereafter applying a non-planar seed layer material which will be used as base onto which a second material will be subsequently electrodeposited.

In a fifth aspect of the invention a fabrication process for forming a multi-layer three-dimensional structure, includes:

(a) forming and adhering a layer of material to a previously formed layer and/or to a substrate; and (b) repeating the forming and adhering operation of (a) a plurality of times to build up a three-dimensional structure from a plurality of adhered layers; wherein the formation of a given layer, includes: (1) selectively transferring a pre-patterned precursor of a masking material which is transformed into a solidified masking material of desired thickness and cross-sectional configuration and adhered to the substrate or a previously formed layer, wherein the mask has at least one extended region of mask material through which at least one void extends, wherein the mask material includes a dielectric, or (1') selectively transferring a pre-patterned mask material of desired thickness and cross-sectional configuration to a substrate or previously formed layer and adhering said mask material to the substrate or a previously formed layer, wherein the mask has at least one extended region of mask material through which at least one void extends, wherein the mask material includes a dielectric; and further includes (2) depositing a first material onto a portion of the substrate or previously formed layer through the at least one void in the mask to form a portion of the given layer; and (3) removing the mask material to leave at least one opening which extends through the deposited first material on the given layer; (4) depositing a second material into the opening through the deposited first material on the given layer; and (5) planarizing at least one of the deposited materials to a level that bounds the given layer.

In a sixth aspect of the invention a fabrication process for forming a multi-layer three-dimensional structure, includes: (a) forming and adhering a layer of material to a previously formed layer and/or to a substrate; and (b) repeating the forming and adhering operation of (a) a plurality of times to build up a three-dimensional structure from a plurality of adhered layers; wherein the formation of a given layer, includes (1) selectively transferring a pre-patterned precursor of a masking material which is transformed into a solidified masking material of desired thickness and cross-sectional configuration and adhered to the substrate or a previously formed layer, wherein the mask has at least one extended region of mask material through which at least one void extends, or (1') selectively transferring a pre-patterned mask material of desired thickness and cross-sectional configuration to a substrate or previously formed layer and adhering said mask material to the substrate or a previously formed layer, wherein the mask has at least one extended region of mask material through which at least one void extends; and (2) electrodepositing a first material onto a portion of the substrate or previously formed layer through the at least one void in the mask to form a portion of the given layer.

In a seventh aspect of the invention a fabrication process for forming a three-dimensional structure, includes: (a) selectively transferring, in association with the formation of a given layer, a pre-patterned precursor of a masking material which is transformed into a solidified masking material of desired thickness and cross-sectional configuration and adhered to the substrate or a previously formed layer, wherein the mask has at least one extended region of mask material through which at least one void extends, or (a') selectively transferring, in association with the formation of a given layer, a pre-patterned mask material of desired thickness and cross-sectional configuration to a substrate or previously formed layer and adhering said mask material to the substrate or a previously formed layer, wherein the mask has at least one extended region of mask material through which at least one void extends; and (b) electrodepositing a first material into the at least one void to form a portion of the given layer.

In a eighth aspect of the invention a fabrication process for forming a multi-layer three-dimensional structure, includes: (a) forming and adhering a layer of material to a previously formed layer and/or to a substrate; and (b) repeating the forming and adhering operation of (a) a plurality of times to build up a three-dimensional structure from a plurality of adhered layers; wherein the formation of at least a given layer, includes: (1) selectively dispensing a mask material in association with the formation of a given layer from at least one computer controlled dispensing device to form a mask of desired thickness and cross-sectional configuration onto the substrate or a previously formed layer, wherein the mask has at least one extended region of mask material through which at least one void extends, wherein the mask material includes a dielectric; and (2) depositing a first material onto a portion of the substrate or previously formed layer through the at least one void in the mask to form a portion of the given layer; and (3) removing the mask material to leave at least one opening which extends through the deposited first material on the given layer; (4) depositing a second material into the opening through the deposited first material on the given layer; and (5) planarizing at least one of the deposited materials to a level that bounds the given layer.

In a specific variation of the eighth aspect of the invention the depositing of the first material or of the second material for the given layer includes an electrodeposition operation; the at least one computer controlled dispensing device includes an ink jet device; the at least one computer controlled dispensing device includes an ink jet device with a plurality of dispensing orifices; and/or the at least one computer controlled dispensing device includes an extrusion device. In another specific variation the mask material undergoes a phase change after being dispensed; the mask material is reacted after dispensing and in a further variation the reaction includes is made to occur by at least one of (1) exposure of the deposited material to a selected radiation, (2) exposure of the deposited material to a chemical, and/or (3) exposure of the deposited material to heat.

In another specific variation the mask material is dispensed as a plurality of droplets. In a further variation, the droplets are initially dispensed in positions sufficiently offset such that gaps exist between at least portions of the droplets and where after additional dispensing occurs such that the gaps are filled in with mask material. In even a further variation the additional dispensing occurs at positions which are offset from the initially dispensed positions.

In another specific variation the dispensing of mask material occurs via the dispensing of droplets in two or more stages where droplets dispensed in association with at least some stages overlap, at least in part, droplets dispensed in association with other stages and wherein earlier dispensed droplets are allowed to transform prior to the dispensing of overlapping droplets. In a further variation the offset positions in non-boundary regions are along boundary regions are located along lines that connect the initially dispensed positions.

In an additional specific variation the mask material is dispensed as a plurality of droplets from a thermally driven ink jet; the mask material is dispensed as a plurality of droplets from a piezoelectric driven ink jet thermal ink jet.

In a ninth aspect of the invention a fabrication process for forming a multi-layer three-dimensional structure, includes: (a) forming and adhering a layer of material to a previously formed layer and/or to a substrate; and (b) repeating the forming and adhering operation of (a) a plurality of times to build up a three-dimensional structure from a plurality of adhered layers; wherein the formation of at least a given layer, includes: (1) selectively dispensing a mask material in association with the formation of a given layer from at least one computer controlled dispensing device to form a mask of desired thickness and cross-sectional configuration onto the substrate or a previously formed layer, wherein the mask has at least one extended region of mask material through which at least one void extends; and (2) electrodepositing a first material onto a portion of the substrate or previously formed layer through the at least one void in the mask to form a portion of the given layer.

In a specification variation of the ninth aspect of the invention the mask material includes a conductive material. In a further variation the formation of at least a plurality of layers additionally includes using the mask material as a building material that remains in place for at least formation of a plurality of layers. In a still further variation the formation of the at least plurality of layers additionally includes: (3) planarizing at least one of the mask material or the first material located on a given layer.

In another specific variation of the ninth aspect of the invention, the mask material includes a dielectric material. In a further variation, the formation of at least a plurality of layers additionally includes using the mask material as a building material that remains in place for at least formation of a plurality of layers. In a still further variation the formation of the at least plurality of layers additionally depositing an adhesion layer material and/or a seed layer material in association with the formation of a given layer after dispensing of the mask material such that the adhesion and/or seed layer material is located within the at least one void and above the mask material. In an even further variation the formation of the at least plurality of layers additionally includes (3) planarizing at least the adhesion layer material and/or seed layer material located above the mask material and at least one of the mask material or the first material located on a given layer such that the level of the deposited material bounds the given layer.

In another variation the masking material is a dielectric and the formation of the at least plurality of layers additionally includes depositing an adhesion layer material and/or a seed layer material in association with the formation of a given layer before dispensing of the mask material such that the adhesion and/or seed layer material is located within the at least one void and below the mask material. In a further variation the formation of the at least plurality of layers additionally includes: (3) removing the mask material after deposition of the first material for the given layer; (4) removing the adhesion layer material and/or seed layer material used in association with the given layer; and thereafter (5) depositing a second material in association with the given layer which includes a dielectric. In a still further variation, the formation of the at least plurality of layers additionally includes: (3) after deposition of the second material, planarizing at one of the deposited materials located on a given layer such that the level of the planarized material bounds the given layer.

In a tenth aspect of the invention a fabrication process for forming a three-dimensional structure, includes: (a) selectively dispensing a mask material in association with the formation of a given layer from at least one computer controlled dispensing device to form a mask of desired thickness and cross-sectional configuration onto the substrate or a previously formed layer, wherein the mask has at least one region of mask material through which at least one void extends; and (b) electrodepositing a first material into the at least one void to form a portion of the given layer.

In a specific variation of the tenth aspect of the invention the operations (a) and (b) are repeated a plurality of times over previously formed layer to form a multi-layer three-dimensional structure. In a further variation portions of at least some previous layers are formed from depositions associated with subsequent layers.

In an eleventh aspect of the invention a process for a process for forming a multilayer three-dimensional structure, includes: (a) forming and adhering a layer of material to a substrate, wherein the substrate may include previously formed layers; and (b) repeating the forming and adhering operation of (a) a plurality of times to build up a three-dimensional structure from a plurality of adhered layers; wherein the formation of at least one layer includes: (i) forming a pinking indentation in a first deposited material in preparation for depositing a seed layer material over the first deposited material, depositing a seed layer material over at least a portion of the first deposited material and into the pinking indentation, and thereafter depositing a second material onto the seed layer material.

In an twelfth aspect of the invention a process for a process for forming a multilayer three-dimensional structure, includes: (a) forming and adhering a layer of material to a substrate, wherein the substrate may include previously formed layers; and (b) repeating the forming and adhering operation of (a) a plurality of times to build up a three-dimensional structure from a plurality of adhered layers; wherein the formation of at least one layer includes: (i) depositing and patterning a first material, where the patterning comprises at least a first patterned region and a second patterned region, where the first patterned region is defined by locations where one of a structural material or a sacrificial material is to be located and the second region is defined at least in part by at least one location where an indentation in a seed layer material will exist as an aid for fabricating the structure but not necessarily as a desired feature of the structure that is to be put to use; (ii) depositing a seed layer material over the first material, depositing a seed layer material over at least a portion of the first deposited material and into the second region; and (iii) thereafter depositing a second material onto the seed layer material.

Further aspects of the invention will be understood by those of skill in the art upon reviewing the teachings herein. Other aspects of the invention may involve combinations of the above noted aspects of the invention. Other aspects of the invention may involve apparatus that are configured to implement one or more of the above method aspects of the invention. These other aspects of the invention may provide various combinations of the aspects, embodiments, and associated alternatives explicitly set forth herein as well as provide other configurations, structures, functional relationships, and processes that have not been specifically set forth above.

BRIEF DESCRIPTION OF THE DRAWINGS

FIGS. 4A-4I schematically depict the formation of a first layer of a structure using adhered mask plating where the blanket deposition of a second material overlays both the openings between deposition locations of a first material and the first material itself.

FIG. 5 provides a generalized process flowchart of a first embodiment of the invention which forms a three-dimensional structure from a conductive material and from a dielectric material.

FIGS. 13A-13J depict side views of the results of various process stages associated with the formation of a first layer of a particular structure according to a particular implementation of the embodiment of FIG. 10 or of the only layer that modifies a substrate according to an implementation of the embodiment of FIG. 12.

FIGS. 13K and 13L depict side views of the state of the process of FIG. 13J where the seed layers for each of the conductive materials is considered to be formed from the conductive material itself and where FIG. 13K depicts the seed layers as being distinct while FIG. 13L depicts the seed layers as being merged into their respective conductive materials.

FIGS. 17A-17D schematically depict side views of various states of an alternative process that involves rolling a cylindrical support carrying a pattern of ink across a substrate for transferring the ink to the surface of a substrate in preparation for depositing layers of a structure on the substrate.

FIGS. 18A-18E schematically depict an alternative embodiment for transferring a patterned ink from a cylindrical support to a substrates.

DETAILED DESCRIPTION OF PREFERRED EMBODIMENTS OF THE INVENTION

Figure 1A:
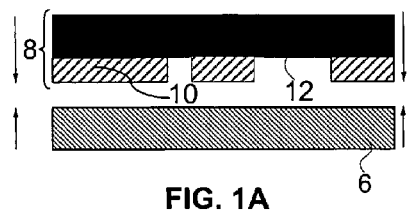
FIGS. 1A-1C schematically depict side views of various stages of a CC mask plating process, while FIGS. 1D-1G schematically depict a side views of various stages of a CC mask plating process using a different type of CC mask.
Figure 1B:
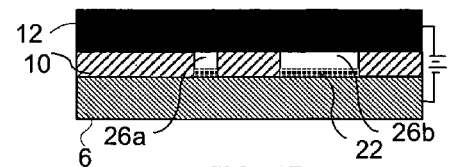
Figure 1C:
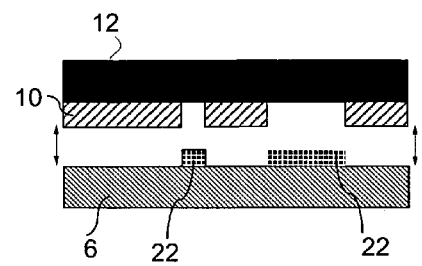
Figure 1D:
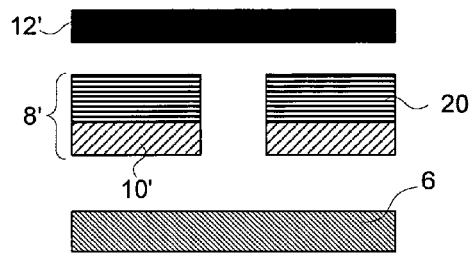
Figure 1E:
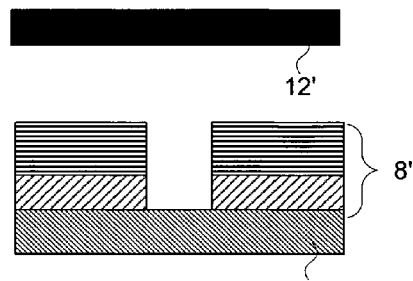
Figure 1F:
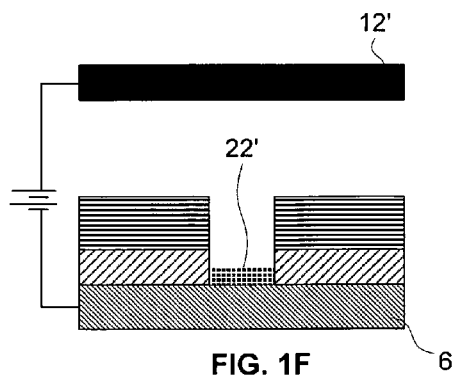
Figure 1G:
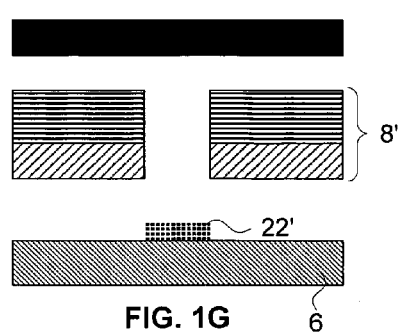
Figure 2A:
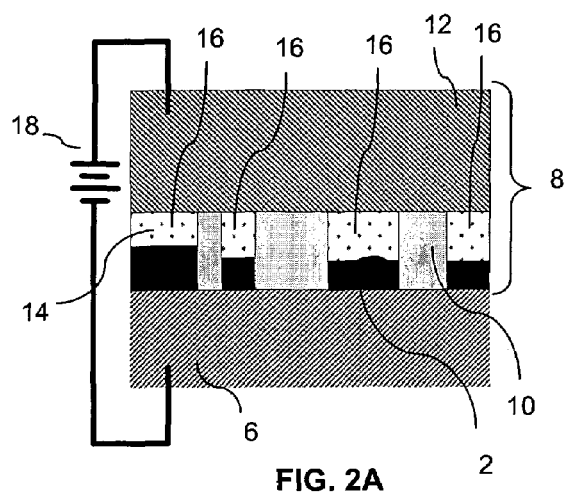
FIGS. 2A-2F schematically depict side views of various stages of an electrochemical fabrication process as applied to the formation of a particular structure where a sacrificial material is selectively deposited while a structural material is blanket deposited.
Figure 2B:
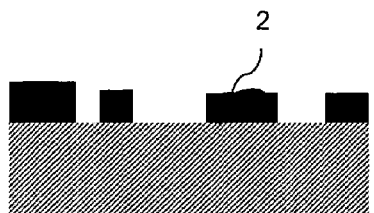
Figure 2C:
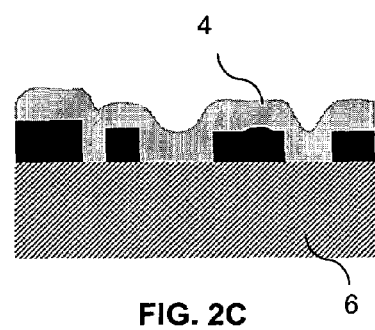
Figure 2D:
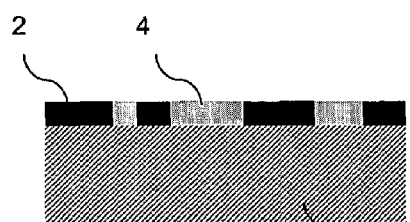
Figure 2E:
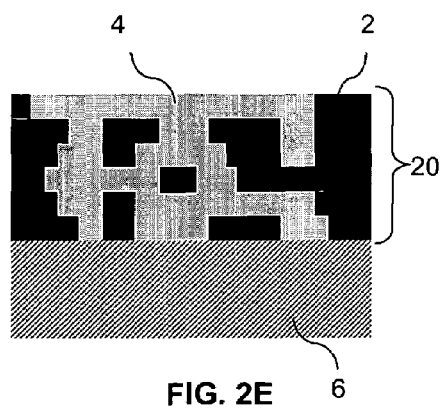
Figure 2F:
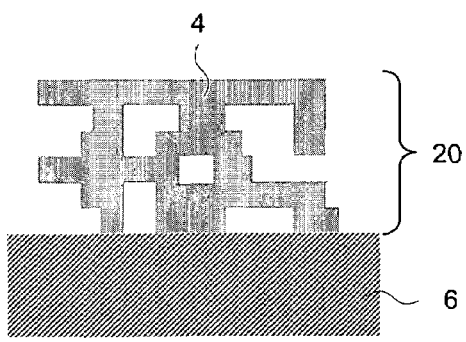
Figure 3A:
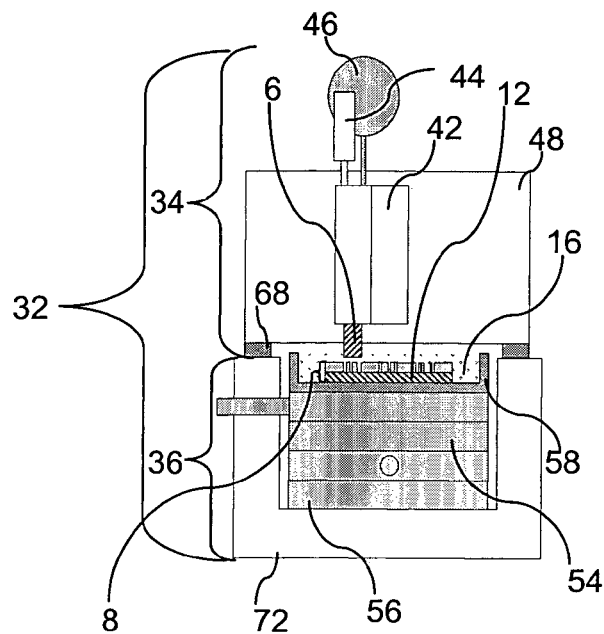
FIGS. 3A-3C schematically depict side views of various example subassemblies that may be used in manually implementing the electrochemical fabrication method depicted in FIGS. 2A-2F.
Figure 3B:
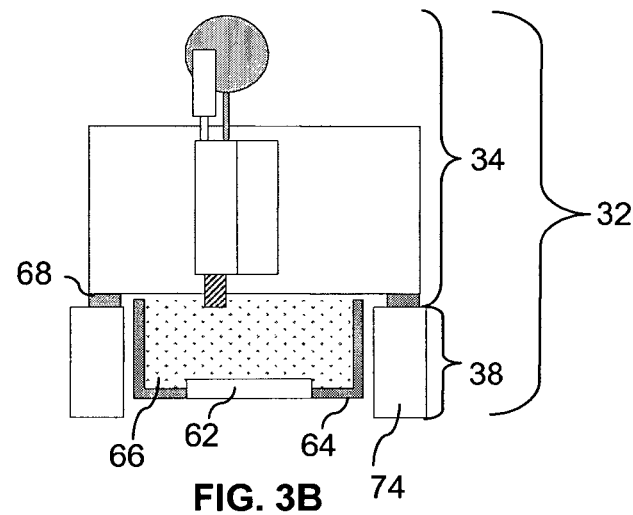
Figure 3C:
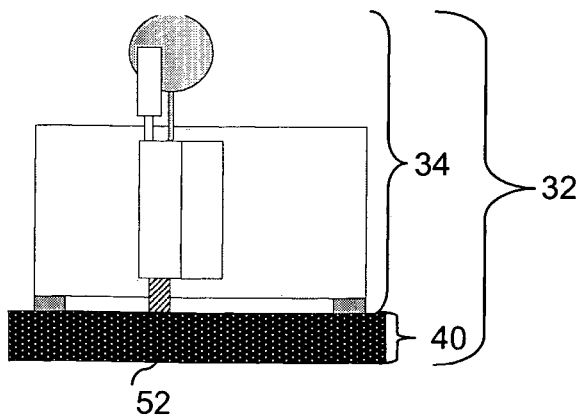

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(*a*)-92(*c*) extending from a surface 86 of the photoresist through the thickness of the photoresist to surface 88 of the substrate 82. In FIG. 4D, a metal 94 (e.g. nickel) is shown as having been electroplated into the openings 92(*a*)-92(*c*). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some of which may be electrodeposited or electroless deposited. Some of these structures may be formed form a single layer of one or more deposited materials while others are formed from a plurality of layers of deposited materials (e.g. 2 or more layers, more preferably five or more layers, and most preferably ten or more layers). In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable.

The various embodiments, alternatives, and techniques disclosed herein may form multi-layer structures using a single patterning technique on all layers or using different patterning techniques on different layers. For example, Various embodiments of the invention may perform selective patterning operations using conformable contact masks and masking operations, proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Adhered mask may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels. Such use of selective etching and interlaced material deposited in association with multiple layers is described in U.S. patent application Ser. No. 10/434,519, by Smalley, and entitled "Methods of and Apparatus for Electrochemically Fabricating Structures Via Interlaced Layers or Via Selective Etching and Filling of Voids" which is hereby incorporated herein by reference as if set forth in full.

FIG. 5 provides a generalized process flowchart of a first embodiment of the invention which forms a three-dimensional structure from a conductive material and from a dielectric material. The process of FIG. 5 begins with block 102 and then moves forward to block 104. Block 104 calls for the defining of a variable "n" to be that of the number of the current layer. It also calls for the defining of a number "N" which corresponds to a number of the final layer of the structure to be formed. After the defining of variables and parameters, the process moves forward to block 106 which calls for setting of variable "n" to a value of 1. The process then moves forward to block 108 which calls for the supplying of a substrate which may include one or more previously formed layers of material or deposits of material.

Next the process moves forward to block 112 which calls for the applying of a dielectric material onto the substrate (or previously formed layer during a second or subsequent loop through the process) and the patterning of the dielectric according to a design for layer n. The application of the dielectric and the patterning of the dielectric may occur in a variety of ways which will be discussed hereinafter.

From block 112 the process moves forward to block 114 which calls for the supplying of a seed layer. In some implementations of the current embodiment, the seed layer is applied in a blanket fashion such that the seed layer material is applied on the dielectric material, on the exposed portions of the substrate (or previously formed layer during a second or subsequent loop through the process) within the voids formed by the patterning of the dielectric material, on the side walls of the dielectric material surrounding the voids, and on the outward facing (e.g. upward or down-ward facing) surface of the dielectric material). In some alternative embodiments, the seed layer may be applied in a selective manner (e.g. where all pockets remain conductively connected but where seed layer material is not necessarily located over all portions of the dielectric material). Some examples of seed layer applying processes for various implementations of the current embodiment will be discussed hereinafter in association with FIG. 6.

From block 114 the process moves forward to block 116 which calls for the deposition of a conductive material. The effective deposition of conductive material will result in the conductive material being deposited on the seed layer coated portions of the substrate (or previously formed layer during a second or subsequent loop through the process) that were exposed via the voids in the dielectric material.

From block 116 the process moves forward to block 118 which calls for the planarization of the deposits. In some implementations of the present embodiment, successful planarization will be that which produces a layer having various distinct regions, e.g. dielectric regions separated from conductive material regions which are surrounded on the sides and substrate/previous layer interface by seed layer material, and possibly an adhesion layer material and/or other material layers providing desired properties (diffusion barrier properties, etching barrier properties, and the like). Successful planarization will result in the removal of any seed layer material and possibly adhesion layer material and/or other material layers that exist over the dielectric material. This planarization process preferably sets the boundary height of the deposited material to correspond to a boundary of layer "n", or in other words set the deposition level to a height equal to that of the layer thickness, LT. The planarization process completes the formation of layer n.

From block 118 the process moves forward to block 122 which calls for incrementing the current layer variable, n, by 1. After block 122, the process moves forward to decision block 124 which inquires as to whether or not variable "n" is greater than N. If the answer is "yes", it implies that formation of all layers of the structure have been completed and the process moves forward to ending block 126. If the inquiry of block 124 produces a negative response, the process loops back to block 112 so that a next layer may be formed.

The various operations of the embodiment of FIG. 5 result in the formation of layered structures that include conductive material, seed layer material and dielectric material. The layered structures may also include adhesion promoting materials, barrier materials, and the like. In these embodiments, seed layer material exists between regions of conductive material located on consecutive layers. On the other hand, dielectric material deposited on one layer is not separated from overlaying dielectric material deposited on an adjoining layer by a seed layer material. The structure may be put to use after formation of the layers, or alternatively, a variety of post processing operations may be performed on the layered structure for a variety of reasons and in a variety of ways.

For example, post processing operations may include one or more of (1) forming additional layers using other techniques then those set forth in FIG. 5, (2) the dicing of structures from other structures that were formed simultaneously, (3) the releasing of a formed structure from any sacrificial material that was used during formation of the structure, e.g. removing the dielectric material to release a structure of conductive material, or removing the conductive material to release a structure of dielectric material, (4) separating the structure from a substrate on which it was built, (5) attaching the structure to another substrate or attaching additional components or elements to the structure, (6) coating the structure with any desired material, (7) smoothing of layer-to-layer discontinuities, (8) performing any desired annealing operations, (9) performing any desired diffusion bonding operations, (10) performing any desired sealing operations, or (11) any desired interfacing operations with other components, structures, devices, and the like.

In some variations of the embodiment, the final structure produced according to the process of FIG. 5, may be a combined structure of the conductive material, the seed layer material and the dielectric material. In other variations, the final structure may be the conductive material and seed layer material with the dielectric material removed. In still other variations, the structure of conductive material separated from the dielectric material with which it was formed may be partially or completely encapsulated in or partially or completely filled with a different dielectric material. In still other variations, the final structure may be the dielectric material itself with the conductive and seed layer materials removed. In even further variations, the structure of dielectric material separated from the conductive material with which it was formed may be partially or completely encapsulated in or partially or completely filled with a different conductive material.

Figure 6:
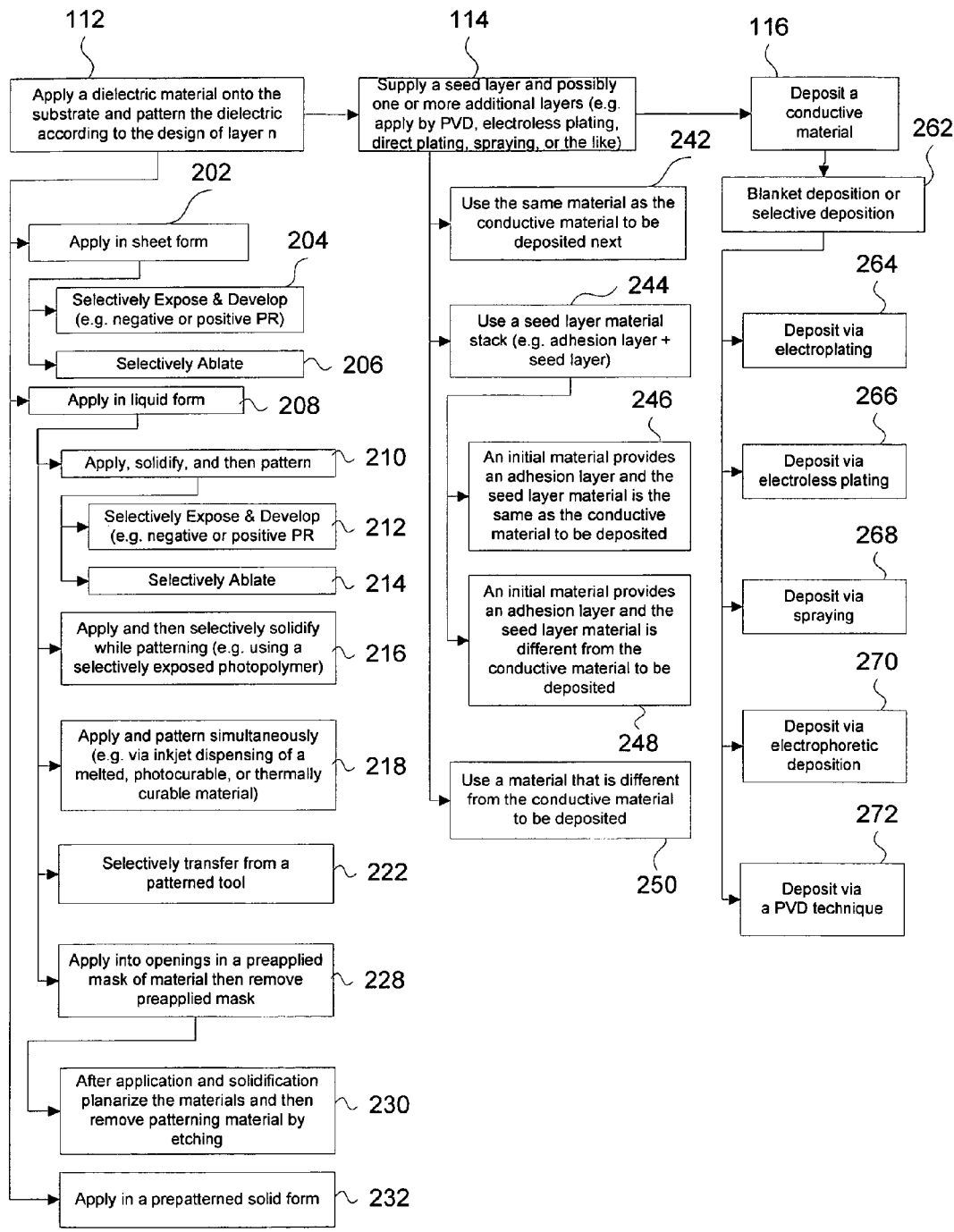
FIG. 6 provides a block diagram of example options that might be used in association with three of the process operations of FIG. 5 according to some potential implementations of various embodiments.

FIG. 6 provides a block diagram of some examples of options or operations that might be used in association with three selected process operations of FIG. 5 according to various alternative embodiments of the invention.

In particular, FIG. 6 provides example operations that may be performed when implementing each of (1) the dielectric material application operation of block 112 of FIG. 5, (2) the seed layer supplying operation of block 114 of FIG. 5, and (3) the conductive material deposition operation of block 116 of FIG. 5.

Operation 112 may be implemented by applying a dielectric material in sheet form as indicated by block 202. As indicated in block 204, the sheet may then be selectively exposed and developed (e.g. when using a negative or positive dry film photoresist material) to pattern the material. Alternatively, as indicated in block 206, portions of the sheet may undergo selective ablation to pattern it.

In still other alternative implementations, as indicated by block 208, operation 112 may be performed by applying a liquid material to the substrate. The application, curing, and patterning of the liquid material may occur in a variety of ways. For example, as indicated by block 210, the liquid material may be applied and then solidified and then patterned. In such implementations, as indicated in blocks 212 and 214, the patterning operation may, for example, be similar to the exposure and developing operations of block 204 or the ablation operation of block 206. In still other alternatives, as indicated in block 216, the liquid material may be selectively solidified and patterned at the same time (e.g. using a selectively exposed photopolymer). In a further alternative, as indicated by block 218, the application of the liquid material may occur simultaneously with patterning such as by selectively dispensing of a material onto the substrate, for example, via an ink jetting or extrusion process where the jetted or extruded material may be dispensed in a melted form which solidifies upon cooling, it may be photocurable whereby after or during dispensing it is exposed to appropriate radiation, or it may be thermally curable whereby after dispensing the material is raised to an appropriate temperature to cause solidification, for example, to cause polymerization or another chemical reaction that results in cohesion.

In another alternative, as indicated by block 222, the dielectric material may be transferred in a prepatterned manner, e.g. by a transfer tool such as a patterned transfer plate. As indicated in block 224 by transferred material may be in a liquid or flowable form which is made to solidify and adhere to the substrate or it may be in a substantially solidified state, In still further alternatives, the masking material may be transferred in a prepatterned and solidified state as indicated by block 232, upon transfer but which is made to adhere to the substrate upon or subsequent to transfer, e.g. by pressure, use of an adhesive, oxygen removal, heating, and the like. In even further alternatives, as indicated in block 228, the masking material may be applied into openings in a pre-applied or formed patterning material that is on the substrate or previously formed layer, after application of the masking material the patterning material may be removed. In one alternative, as indicated in block 230, after application of the masking material and prior to removal of the patterning material, the two materials may be planarized and then the patterning material removed by, e.g. selective etching or dissolution.

The seed layer supplying operation 114 may be implemented in a variety of different ways, for example, by physical vapor deposition, chemical vapor deposition, electroless plating, an electroplating strike process (e.g. a Woods nickel strike), and/or direct plating or metallization. Direct plating may take several forms: (1) using the Futuron™ process of Atotech Deutschland GmbH, Berlin, Germany; (2) using the Envision DPS process of Enthone-OMI; (3) using the Connect Process of M & T; (4) using the Black Hole process of the Hunt Company; (5) using the Black Hole II process of MacDermid Co.; (6) using the Shadow process of the Electrochemicals Inc., Maple Plain, Minn., USA; (7) using the Graphite 200 process of Shipley Company, L.L.C., Marlborough, Mass., USA; (8) using the SMS-E process of Blasberg Co., Germany; or (9) the Compact CP process of Atotech Skandinavien AB, or the like.

In some implementations, as indicated by block 242, the seed layer material may be the same material as the conductive material. In other implementations, as indicated by block 244, the seed layer may be accompanied by one or more other materials which may provide adhesion enhancing properties, diffusion limiting properties, etching barrier properties, other desired transitional properties, or the like. When using a seed layer in combination with an adhesion layer, for example, they both may be applied by sputtering with the adhesion layer being applied first and the seed layer being applied second. In some embodiments, an adhesion layer and a seed layer may be applied during the same vacuum operation to avoid having the adhesion layer become passivated prior to coating it with the seed layer material. In still other embodiments, application of an adhesion layer may be followed by application of a seed layer with various operations occurring there between. For example, one of the materials may be an adhesion enhancing material such as titanium, chromium, or titanium tungsten, or the like. The seed layer material may be sputtered copper, sputtered nickel, nickel from a strike, electroless copper, electroless nickel, sputtered gold, and the like, which may provide a transition layer material that allows improved electroplating ability or the like. In some embodiments, a seed layer material may be over coated with another material that provides a barrier or other transitional properties between it and the bulk of a conductive material that will be used in building up layers.

The use of a multi-material seed layer stack (e.g. an adhesion layer and a seed layer) may be provided in different ways. For example, as indicated by block 246, the first material may provide an adhesion layer and the second material may be the same as the conductive material that is to be deposited. Alternatively, as indicated in block 248, the first material may provide an adhesion layer and the second material may be different from the conductive material that is to be deposited.

In a further alternative, as indicated in block 250, operation 114 may be implemented by using a single material that is deposited as a thin layer where the material is different from the conductive material that will be deposited over it. The implementation of operation 114 preferably results in formation of a very thin coating that will (1) allow subsequent electrodeposition or other deposition operations to occur, (2) provide adequate adhesion between the conductive material and the dielectric material, (3) allow the deposition of the conductive material in a desired manner, and (4) not significantly negatively impact the desired mechanical, electrical, or thermal properties of the structure.

In some embodiments of the invention, it may be desirable to remove the seed layer material from the sidewalls of the conductive material. This removal may occur via an etching operation, after deposition of the conductive material and removal of the masking material on which the seed layer material was deposited. To ensure that interlayer adhesion is not undermined by such etching, the seed layer or seed layer stack is preferably as thin as possible, for example, in some embodiments an adhesion layer material may have a thickness in the range of 50-1000 angstroms, more or less, and is preferably in the range 100-500 angstroms, while the seed layer itself may have a thickness in the range of 0.1-1.0 microns, more or less, and more preferably about 0.2-0.5 microns.

The deposition of a conductive material as called for by block 116 may be implemented in a variety of ways. For example, via blanket or selective electroplating (block 262), via blanket or selective electroless plating (block 264), via spraying such as thermal spraying of metal (block 266), via blanket or selective electrophoretic deposition (block 268), and/or via a physical vapor deposition technique (block 270), or the like.

Figure 7A:
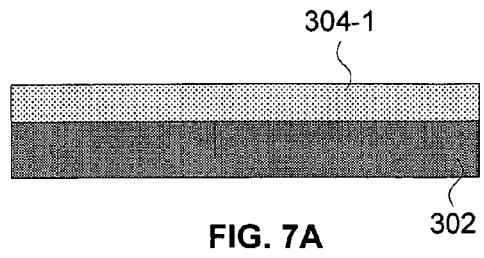
FIGS. 7A-7J depict the results of various process stages associated with the formation of the first two layers of a particular structure according to a particular implementation of the embodiment of FIG. 5.

FIGS. 7A-7(j) depict schematic representations of side views of the results of various process stages associated with the formation of the first two layers of a particular structure according to a particular implementation of the embodiment of FIG. 5. FIG. 7A depicts a substrate 302 overlaid by a uniform coating or sheet of a dielectric material 304-1. It should be understood that substrate 302 may include previously formed layers of material and that it may or may not have a surface that is entirely conductive (e.g. the whole or a portion of the surface may be dielectric, semi conductive, conductive, or some combination thereof).

Figure 7B:
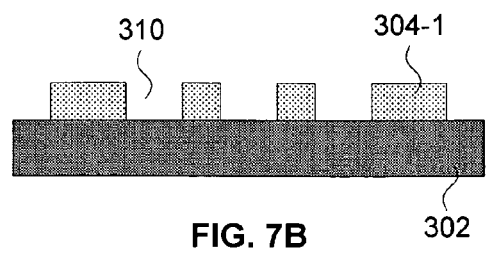
Figure 7C:
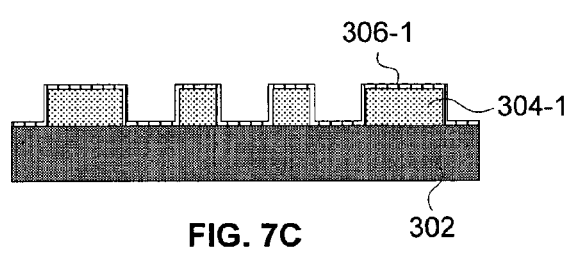
Figure 7D:
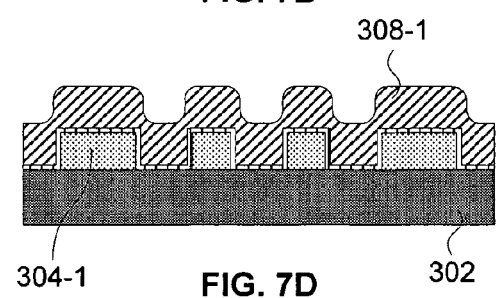

FIG. 7B depicts the state of the process after dielectric material 304-1 has been selectively patterned to reveal voids 310 in the dielectric that expose portions of a surface of substrate 302. FIG. 7C depicts the state of the process after formation of a seed layer 306-1. FIG. 7D shows the state of the process after a blanket deposition of a conductive material 308-1 fills the voids.

Figure 7E:
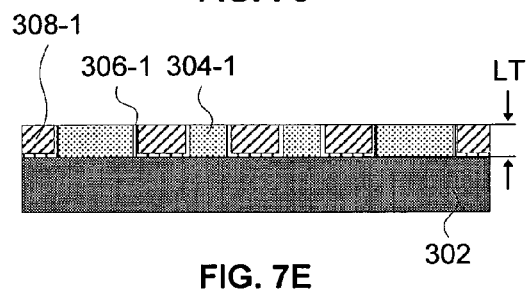
Figure 7F:
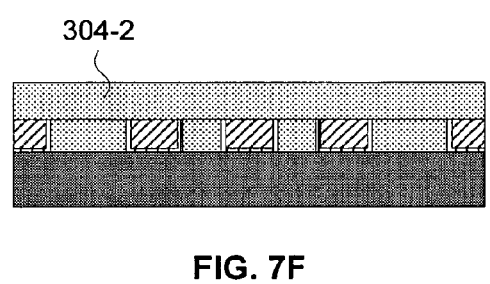
Figure 7G:
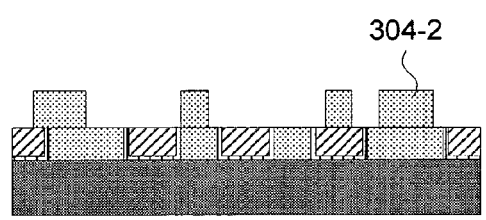
Figure 7H:
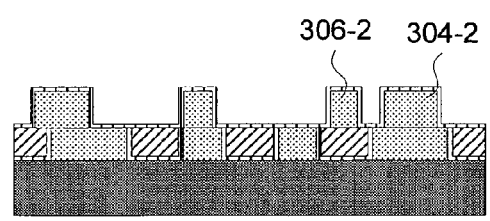
Figure 7I:
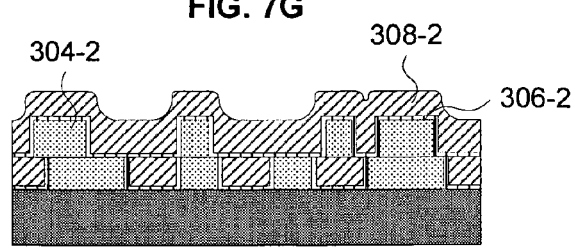

FIG. 7E depicts the state of the process after the formation of the first layer is completed as the result of a planarization operation that trims the height of the deposited materials to that of a first layer thickness LT. The first layer includes regions of (1) dielectric material 304-1 and (2) conductive material 308-1 which are surrounded on the substrate and dielectric sides by seed layer material 306-1.

Figure 7J:
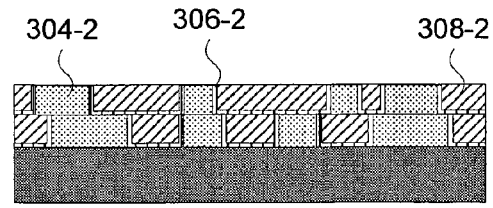

FIGS. 7F-7(j) depict states of the process associated with the formation of a second layer. The states of the process during formation of the second layer are similar to those shown in FIGS. 7A-7E for the first layer. FIG. 7(j) depicts the state of the process after completed formation of the second layer. The second layer includes regions of (1) dielectric material 304-2 and (2) conductive material 308-2 bounded on the substrate and dielectric sides by seed layer material 306-2.

Though FIGS. 7A-7(j) depict the formation of only the first 2 layers of a structure, it is clear that the structure may include additional layers for which the process operations may be repeated so as to build up a taller and potentially more complex structure. It should be understood that in some embodiments other operations may be used to form some layers of the structure. Some alternative operations for other implementations of embodiments of the invention will be discussed herein later.

Figure 8:
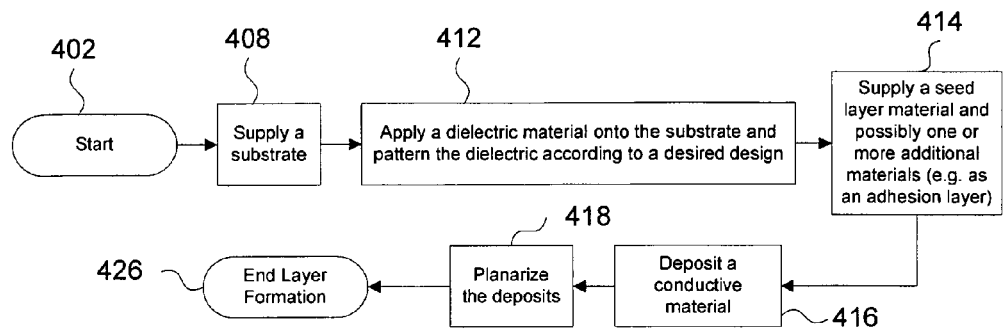
FIG. 8 provides a generalized process flowchart of a second embodiment of the invention which modifies a substrate by applying a conductive material and a dielectric material thereto.

FIG. 8 provides a generalized process flowchart of a second embodiment of the invention which modifies a substrate by applying a conductive material and a dielectric material thereto.

The embodiment of FIG. 8 is similar to that of FIG. 5 with the exception that it calls for the formation of a single layer of material on a substrate. Operations 402, 408, 412, 414, 416, 418 and 426 correspond essentially and respectively to operations 102, 108, 112, 114, 116, 118 and 126 of FIG. 5.

Figure 9:
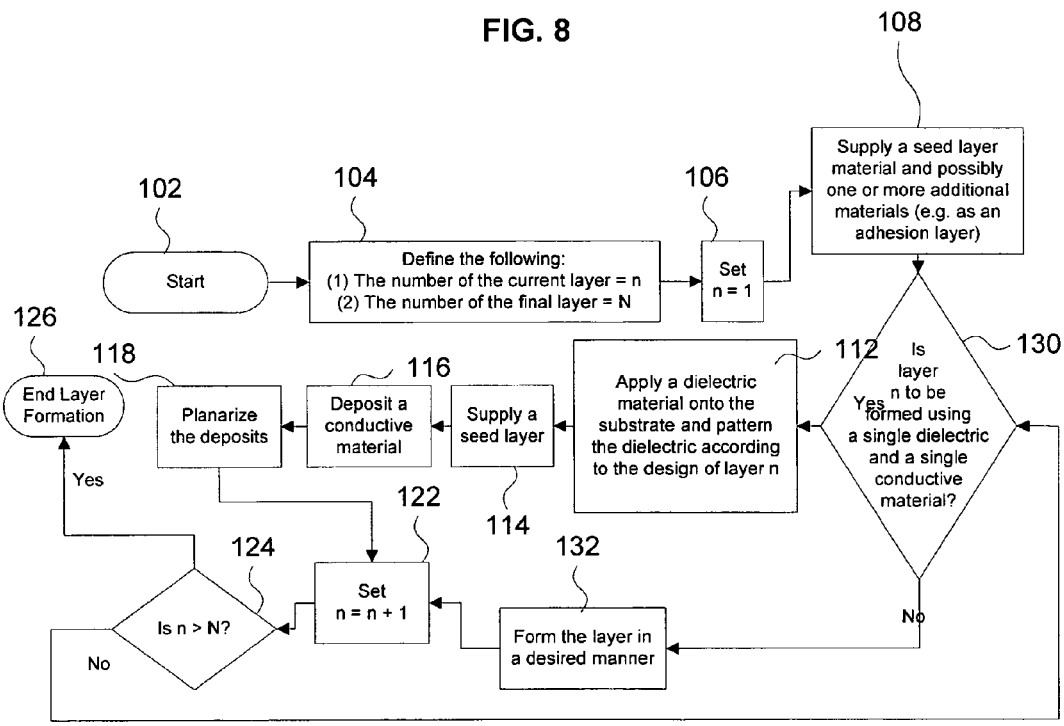
FIG. 9 provides a generalized process flowchart of a third embodiment of the invention which forms a three-dimensional structure from a conductive structural material and from a dielectric material on at least one layer.

FIG. 9 provides a generalized process flowchart of a third embodiment of the invention which forms a three-dimensional structure from a conductive material and from a dielectric material. The embodiment of FIG. 9 is similar to that of FIG. 5 with the exception that it contemplates the possibility that some other generalized process may be used to form one or more of the layers of the structure. In FIG. 9 similar operations to those shown in FIG. 5 are indicated with equivalent reference numbers. The process of FIG. 9 and that of FIG. 5 proceed in similar manners up through operation 108 after which the process of FIG. 9 moves forward to decision block 130 where an inquiry is made as to whether or not layer "n" is to be formed using a single dielectric and a single conductive material.

If this inquiry produces a positive response the process proceeds along a path that implements elements 112-124 in a manner analogous to that of the embodiment of FIG. 5. If decision block 130 produces a negative response, the process moves forward to block 132 which calls for the formation of layer "n" in a desired manner but presumably a different manner than that called for by blocks 112-124. From block 132 the process moves to block 122 then to block 124 which have been previously discussed. A negative decision from block 124 loops the process back to block 130 while a positive response moves the process forward to block 126 which ends the layer formation process as all layers have been formed. In some alternative embodiments, even if the next layer to be formed is formed with a single conductive material and a single dielectric, a process different than that set forth by operations 112-124 may be used.

The formation of layer "n" in an alternative manner as called for by block 132 may occur in a variety of different ways. The processing of layer "n" in this alternative manner may in part be dictated by the materials to be deposited on layer "n" as well as possibly the exact configuration of layer "n" compared to that of the previous layer. For example, if layer "n" does not include a dielectric material but layer "n-1"

did, layer "n" may need to have a conductive sacrificial material and a conductive structural material deposited but it may also need to have a seed layer deposited as well. It may also need an adhesion layer to be applied. If layer "n-1" was formed from only conductive materials, there may be no need to use a seed layer when forming layer "n" even if layer "n" includes a dielectric material. Various other layer formation processes may be implemented in association with block 132 and will be understood by those of skill in the art in some of these alternatives the formation processes need not be limited to electrochemical fabrication methods.

In some alternative processes, each layer of the structure may be formed using a conductive structural material, a conductive sacrificial material, and a dielectric material. In one such alternative embodiment, an adhesion layer and an overlying seed layer may be applied to a previous layer, a selective deposition of either a conductive structural material or a conductive sacrificial material may occur, portions of the seed layer and adhesion layer that have not received the initial deposit of conductive material may be removed, for example, by chemical or electrochemical etching. Next an additional adhesion layer (if necessary) and an additional seed layer material may be deposited. The adhesion layer material and/or seed layer material may be different from the initial adhesion layer and seed layer materials. In some embodiments they may be specifically selected for their compatibility with the second conductive material to be deposited. One or both of the adhesion layer and seed layer materials that underlie sacrificial material are preferably removable along with the sacrificial material while the adhesion layer and seed layer materials underlying structural material are preferably not significantly damaged by the removal of the sacrificial material. In this alternative layer forming process, as described above, the removal of the second seed layer material, and possibly adhesion layer material, located on the deposits of the first deposited conductive material may occur via a planarization operation or the like. In embodiments where the second deposited conductive material occurs in a selective manner and thus does not overlay the regions where the first deposited conductive material exist, removal of any seed layer material, and possibly adhesion layer material from above the first conductive material may occur via an etching operation or the like. In this alternative process, dielectric material desired on selected layers may be deposited and patterned prior to deposition of the first adhesion and seed layer materials, after deposition of the first conductive material and prior to deposition of the second adhesion and seed layer materials, or after deposition of the second conductive material. In some alternative embodiments, selective etching operations may be used to create voids in which the dielectric material or second conductive material may be located.

Figure 10:
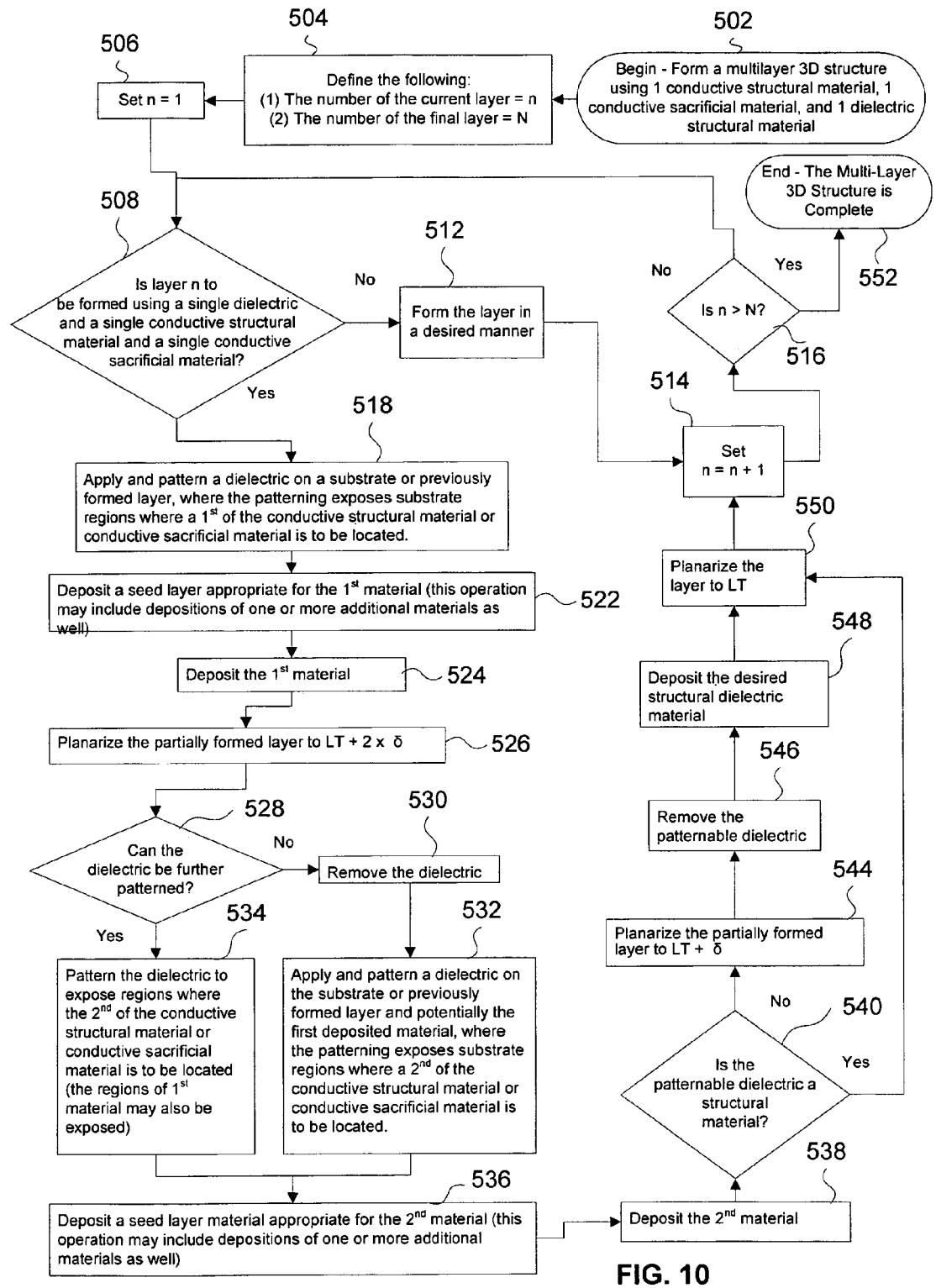
FIG. 10 provides a generalized process flowchart of a fourth embodiment of the invention which forms a three-dimensional structure from a conductive structural material, a conductive sacrificial material and a dielectric material on at least one layer.

FIG. 10 provides a generalized process flowchart of a fourth embodiment of the invention which forms a three-dimensional structure from a conductive structural material, a conductive sacrificial material and a dielectric material on at least one layer.

The process set forth in the flowchart of FIG. 10 begins at element 502 and from there proceeds to block 504. Block 504 calls for the defining of a variable "n" to be equal to the number of the current layer being processed. It also defines a value "N" as the number associated with the final layer of the structure.

From block 504 the process moves forward to block 506 which calls for setting "n" to a value of one. From block 506 the process moves forward to decision block 508 which inquires as to whether or not layer "n" is to be formed using a single dielectric material, a single conductive structural material and a single conductive sacrificial material. A negative response to this inquiry of block 508 sends the process forward to block 512 which calls for the formation of the layer in any desired manner. The desired manner may be one of the alternatives discussed above with regard to block 132 of FIG. 9 or it may be some other manner which may have been described hereinbefore or hereinafter or set forth in one of the applications incorporated herein by reference or be based on a combination of those teachings or simply be known to those of skill in the art.

From block 512 the process moves forward to block 514 which will be discussed herein later. A positive response to block 508 sends the process forward to block 518. Block 518 calls for the applying and patterning of a dielectric onto a substrate or previously formed layer where the applying and patterning result in those portions of the substrate being exposed where a first conductive material is to be deposited which may be of the structural or sacrificial type.

From block 518 the process moves forward to block 522 which calls for the depositing of a seed layer (and possibly of an additional one or more materials, e.g. an adhesion layer) that is appropriate for use with the first conductive material that is to be deposited. After formation of the seed layer, the process moves forward to block 524 which calls for deposition of the first conductive material.

From block 524 the process moves forward to block 526 which calls for planarizing of the partially formed layer to a height equal to the layer thickness plus an extra amount (e.g. two times an incremental amount $\delta$). Such a planarization height may be selected as it allows multiple additional planarization operations to occur with each being separated from the other by an amount $\delta$, or more, where the amount $\delta$ is equal to or larger than a tolerance associated with each planarization operation. Such multiple planarization operations during the formation of a single layer are preferred in the present embodiment as they enhance the accuracy of the structures being formed. However, in various alternate embodiments it may be possible to vary the planarization height and to vary the number of planarization operations used during the formation of a given layer.

From block 526 the process moves forward to decision block 528 which inquires as to whether or not the dielectric material can be further patterned. If this inquiry produces a negative response, the process moves forward to block 530 which calls for the removal of the dielectric. This removal process may occur in a variety of ways depending on the type of dielectric material present. For example, if the dielectric material is a photoresist, standard techniques associated with the stripping of photoresist may be used.

From block 530 the process moves forward to block 532 which calls for the application and patterning of a dielectric material on the substrate or previously formed layer and potentially onto the first deposited conductive material. The patterning exposes those portions of the substrate where a second of the conductive materials is to be located. The patterning may also result in a surface of the first deposited conductive material being exposed. Such exposure will be without detriment as later in the process a planarization operation will be used to remove any material deposited onto the first conductive material.

From block 532 the process moves forward to block 536 which will be discussed herein later. A positive response to the inquiry of decision block 528 causes the process to move forward to block 534 which calls for the patterning of the dielectric to expose regions where the second of the conductive materials is to be deposited.

From block 534, the process moves forward to block 536. Block 536 calls for the deposition of a seed layer that is appropriate for use with the second conductive material that is to be deposited. The seed layer may be part of a seed layer stack that includes one or more additional materials which may be deposited before the seed layer or after the seed layer (e.g. it may be preceded by the deposition of an adhesion enhancing layer).

From block 536 the process moves forward to block 538 which calls for the deposition of the second conductive material. Further discussion concerning the operations of blocks 518-536 will be provided hereinafter in association with the discussion of FIGS. 11A and 11B.

From block 538 the process moves forward to decision block 540 which inquires as to whether or not the patternable dielectric is a structural material or at least a material that will remain as part of the formed layer. A positive response to this inquiry causes the process to move forward to block 550 which will be discussed hereinafter but a negative response to the inquiry causes the process to move forward to block 544. Block 544 calls for the planarization of the partially formed layer to a level equal to the layer thickness plus an incremental amount δ.

From block 544 the process moves forward to block 546 which calls for the removal of the patternable dielectric and thereafter the process moves forward to block 548 which calls for the deposition of the desired structural dielectric material.

From block 548, as with block 540, the process moves forward to block 550 which calls for a planarization of the layer to a level which is intended to bound the layer or in other words to a height equal to that of the layer thickness.

From block 550 as with block 512 the process moves forward to block 514 which calls for incrementing the layer number variable, "n", by one.

From block 514 the process moves forward to decision block 516 which inquires as to whether or not "n" has exceeded the final layer number. If a positive response is provided by this inquiry, it means that all layers of the structure have been formed and the process moves forward to end block 552. On the other hand if the inquiry produces a negative response, the process loops back to block 508 so that a next layer of the structure may be formed.

As with the previously discussed processes, after formation of all layers of the structure, various post processing operations may be performed. In particular as one of the deposited conductive materials is a sacrificial material it is anticipated that that sacrificial material will be removed at some point during post processing operations but it is conceivable that in some applications the sacrificial material may be removed during use of the structure as opposed to during a pre-use post processing operation.

Figure 11A:
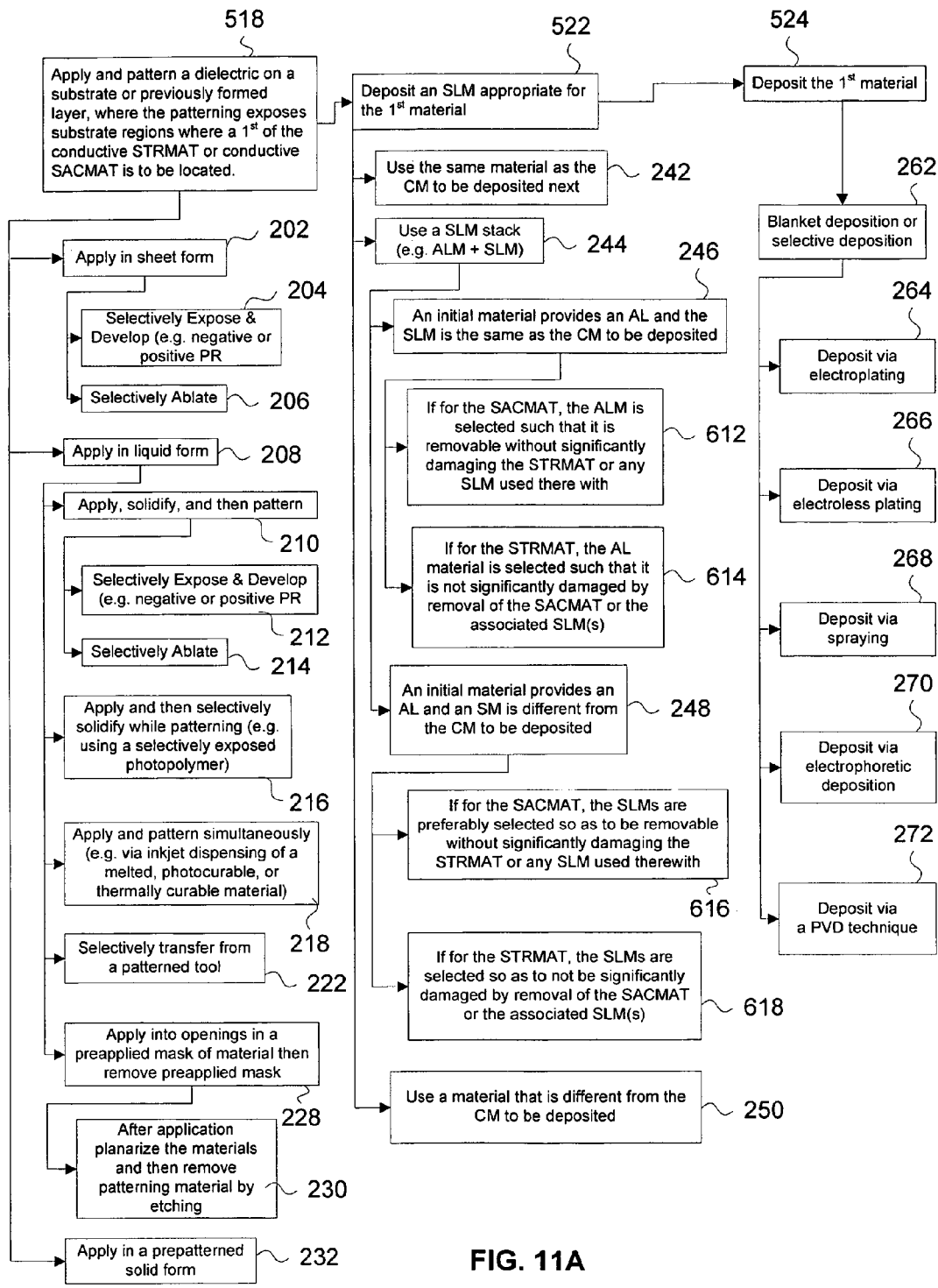
FIGS. 11A and 11B provide block diagrams of example options that might be used in association with various process operations of FIG. 10 according to some potential implementations of various embodiments.
Figure 11B:
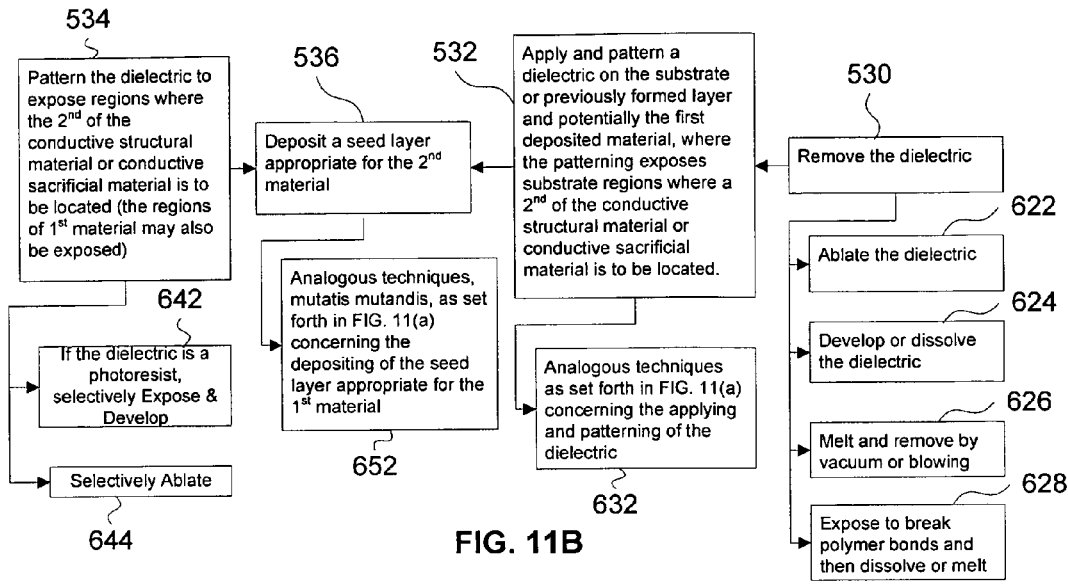

FIGS. 11A and 11B provide block diagrams of example options that might be used in association with various process operations of FIG. 10 according to some potential implementations of some embodiments.

FIG. 11A provides some examples of variations that are possible for use in implementing operations 518, 522, and 524 of the process of FIG. 10. To a large extent the various alternative implementations of FIG. 11A are analogous to those set forth in FIG. 6 concerning example variations of implementations associated with the process of FIG. 5. As such many of the blocks of FIG. 11A have been identified with identical reference numerals to those used in association with FIG. 6. As those particular alternatives have already been discussed in association with FIG. 6, they will not be discussed herein at this time, but instead the reader is directed to the discussion set forth above concerning FIG. 6. However, FIG. 11A does include some additional implementation alternatives which result from the fact that two conductive materials are being used on at least some layers and more particularly due to the fact that one of the conductive materials is a structural material while the other is a sacrificial material. In particular, the operation of block 246 has two options associated with it. Similarly the operation alternative associated with block 248 has two options associated with it.

Block 246 calls for use of a seed layer stack where an initial material provides an adhesion layer and where a subsequently deposited seed layer material is the same as the first conductive material to be deposited.

Block 612 sets forth a first option which is based on the first conductive material being the sacrificial material (SACMAT). In this case, the adhesion layer (AL) material (ALM) is preferably selected such that it is removable from (1) the structural material (STRMAT) and (2) any structural material seed layer (SL) or seed layer stack without significantly damaging them when it is removed. This preferred property of the adhesion layer relative to the other materials may not be necessary with regard to all the other materials in the build but instead only to those that the object geometry or process bring into contact with the particular adhesion layer material. For example, the adhesion layer material for the sacrificial material may be the same as that for the structural material and portions of the two seed layer materials may contact one another but in critical regions (e.g. between structural material on the present layer and structural material on the previous layer) geometric considerations (e.g. the thinness of the adhesion layer and the associated lack of access to attack it) make the use of the selected adhesion layer material acceptable. Similar considerations to those set forth here may apply in various ways to the other embodiments set forth herein and in some circumstances they may apply to seed layer materials as well.

Block 614 sets forth an option that is appropriate to use when the first conductive material is the structural material. It calls for the adhesion layer material being selected such that it will not be significantly damaged by the removal of sacrificial material or an associated seed layer material. More particularly, it is the adhesion layer material located between the structural material of the present layer and material on the previous layer that should not be damaged. Minimization to damage of this sandwiched adhesion layer material may result from an inertness of the adhesion layer material to the etchant or etching process used to remove the sacrificial material or it may simply result from the thinness of the adhesion layer material and the inability of the etchant to effectively attack it. It may or may not be relevant if any adhesion layer material located on a sidewall of the structural material is removed. If necessary, such removal may be accommodated for by an adjusting of the size of layer feature regions based on the processing that will be used in fabricating the structure. Such size adjustments may be made empirically, theoretically, manually, or automatically by appropriate programming of data manipulation and/or control software or they may be made by redesigning the structure so that the final size (after removal of the adhesion layer material) is the desired size. It is believed that in most circumstances such adjustment will not be warranted due to the typical thinness of the adhesion layer.

Block 248 calls for the use of a seed layer material stack where an initial material provides an adhesion layer and a subsequent material provides the seed layer which is different from the conductive material that is to be deposited.

Block 616 sets forth an option that is appropriate when the conductive material to be deposited is the sacrificial material.

In such cases the seed layer stack materials are preferably selected so as to be removable without significantly damaging any exposed structural material, any exposed structural material seed layer material or seed layer stack materials (particularly those involved in adhering layers to one another), or any other exposed materials associated therewith.

Block 618 sets forth an option that is appropriate when the conductive material to be deposited is the structural material. In such cases the seed layer material or seed layer stack of materials, to the extent that they will be exposed to sacrificial material and sacrificial seed layer material etchants, should be selected so that they are not significantly damaged by the removal of the sacrificial material or its associated seed layer material or other associated materials (e.g. adhesion layer or barrier layer materials).

FIG. 11B sets forth examples of some alternative implementations for operations 530, 532, 536 and 534 of FIG. 10. In particular operation 530 which calls for the removal of the dielectric material may be implemented for example by ablating the dielectric (block 622), developing or dissolving the dielectric material (block 624), melting and removing the dielectric material possibly with the aid of vacuuming it up or blowing it off (block 626), or by exposing the material to radiation to break polymer bonds and thereafter dissolving or melting the material (block 628).

Examples of alternative implementations for the applying and patterning operations of block 532 as indicated by block 632 are similar to those associated with the applying and patterning operations of block 518 as set forth in FIG. 11A.

Examples of alternative implementations for the depositing of a seed layer, or seed layer stack, as set forth in block 536 are analogous to the alternatives set forth in FIG. 11A for the seed layer depositing operation 522.

Examples of alternative implementations for the dielectric patterning operation of block 534 include the selective exposure and development of the dielectric, for example, when it is a photoresist material (block 642) or via the selective ablation of the dielectric material (block 644).

Figure 12:
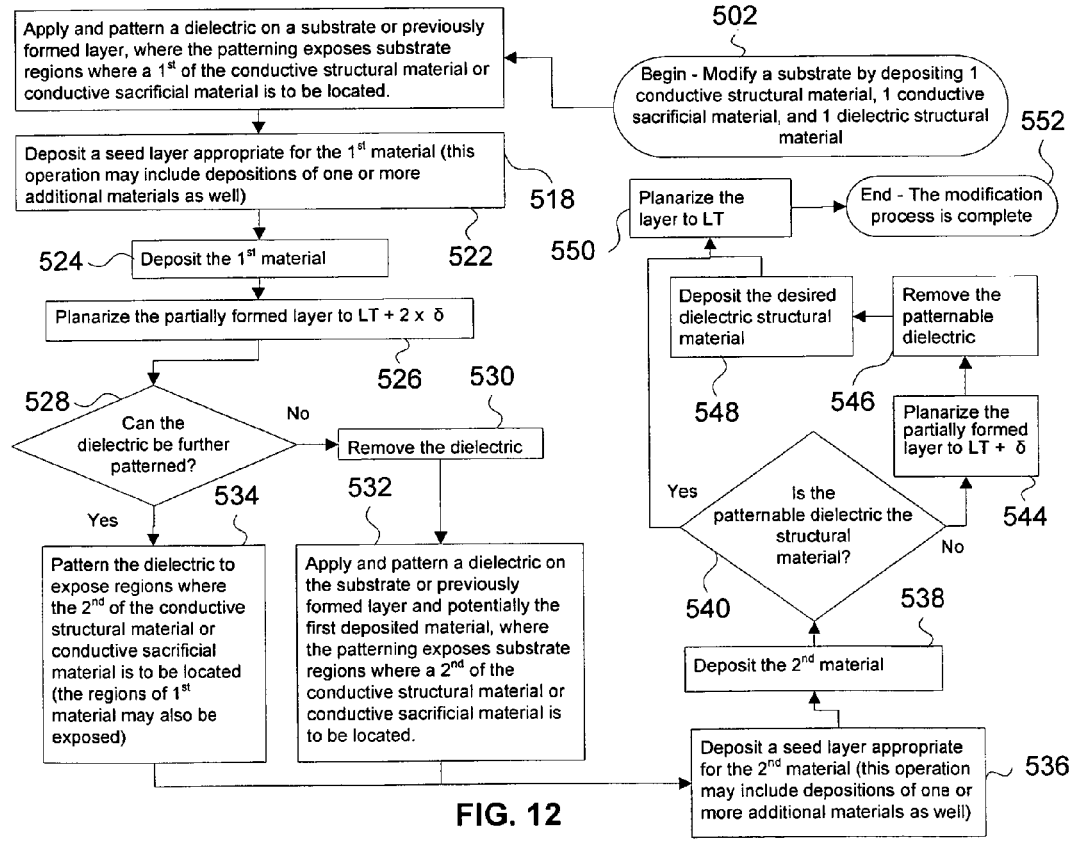
FIG. 12 provides a generalized process flowchart of a fifth embodiment of the invention which modifies a substrate by applying at least two different conductive materials and at least one dielectric material thereto.

FIG. 12 provides a generalized process flowchart of a fifth embodiment of the invention which modifies a substrate by applying at least two different conductive materials and at least one dielectric material thereto.

The embodiment of FIG. 12 is similar to the embodiment of FIG. 10 with the exception that as illustrated the embodiment of FIG. 12 forms a single layer and thus provides a single build process for the formation of that layer as opposed to providing an alternative build process for use on some layers as block 512 of FIG. 10 did.

Blocks associated with the operations of FIG. 12 have been labeled with identical reference numerals as their corresponding blocks in FIG. 10.

Various other alternatives to the processes of FIGS. 10 and 12 are possible. For example, not all layers (of a multi-layer embodiment) may include each of the three materials. In such processes additional decision points may be added to remove consideration of unnecessary operations from the process on those layers (see for example the flowchart of FIG. 15 to be discussed hereafter). In addition, for example, if a given layer did not include a conductive sacrificial material, the process may skip all operations from 526 to 538 (in other words the process may skip from block 524 directly to block 540). As another example, if some layers do not include a structural dielectric material, the process may flow from block 524 to a planarization operation like that of 526 but where the level of planarization would be LT+δ and thereafter the process might move forward to block 530, and then directly from block 530 to block 536 or even block 538 depending on what material types exist and also potentially on their positioning on the previous layer, layer "n-1". The process then might skip from block 538 directly to block 550. It will be understood by those of skill in the art that many additional alternative processes are possible including those with fewer decision blocks and those with more decision blocks as well as those with fewer or more operations, those with different operations, and those with operations that have a different order and thus take on somewhat different features.

FIGS. 13A-13(*j*) schematically depict side views of the results of various process stages associated with the formation of a first layer of a particular structure according to a particular implementation of the embodiment of FIG. 10. Alternatively, FIGS. 13A-13(*j*) may be considered to schematically depict side views of the results of various process stages associated with the modification of the substrate according to an implementation of the embodiment of FIG. 12.

FIG. 13A depicts the state of the process after supplying a substrate 702 while FIG. 13B depicts the state of the process after formation of a dielectric coating or application of a dielectric sheet 704 to the surface of substrate 702.

FIG. 13C depicts the state of the process after dielectric coating 704 has been patterned to form voids 710 that expose selected portions of the surface of substrate 702.

FIG. 13D depicts the state of the process after a seed layer 706 has been deposited onto the dielectric 704 and into the voids or valleys in the dielectric material that extend and cover the surface of a substrate. The dielectric material is selected to be appropriate for the conductive material which is shown as having been deposited in FIG. 13E. In some alternative embodiments the seed layer may be replaced by a multi-material seed layer stack.

Next a planarization operation occurs which trims the surface of the deposited materials to a height of one layer thickness or more preferably to a height slightly greater then one layer thickness. This planarization process removes the conductive material 708 and the seed layer material 706 that overlays the dielectric material as shown in FIG. 13F. Next a second dielectric material patterning operation is performed to open up locations where a second conductive material is to be deposited. This patterning operation produces voids 720 in the dielectric material as shown in FIG. 13G.

Next a seed layer appropriate for use with the second conductive material to be deposited is applied as indicated by reference numeral 716 in FIG. 13H.

Next the second conductive material 718 is deposited in a blanket fashion as indicated in FIG. 13I and thereafter the deposited materials are planarized to a net effective height of one layer thickness. The planarization operation removes the second conductive material that overlays both the dielectric material and the first conductive material and also removes the seed layer material that overlaid the dielectric material and the first conductive material as shown in FIG. 13J.

FIGS. 13K and 13L depict side views of the state of the process of FIG. 13J where the seed layers for each of the conductive materials are considered to be formed from the conductive materials themselves. FIG. 13K depicts the seed layers as being distinct while FIG. 13L depicts the seed layers as being merged into their respective conductive materials.

Figure 14:
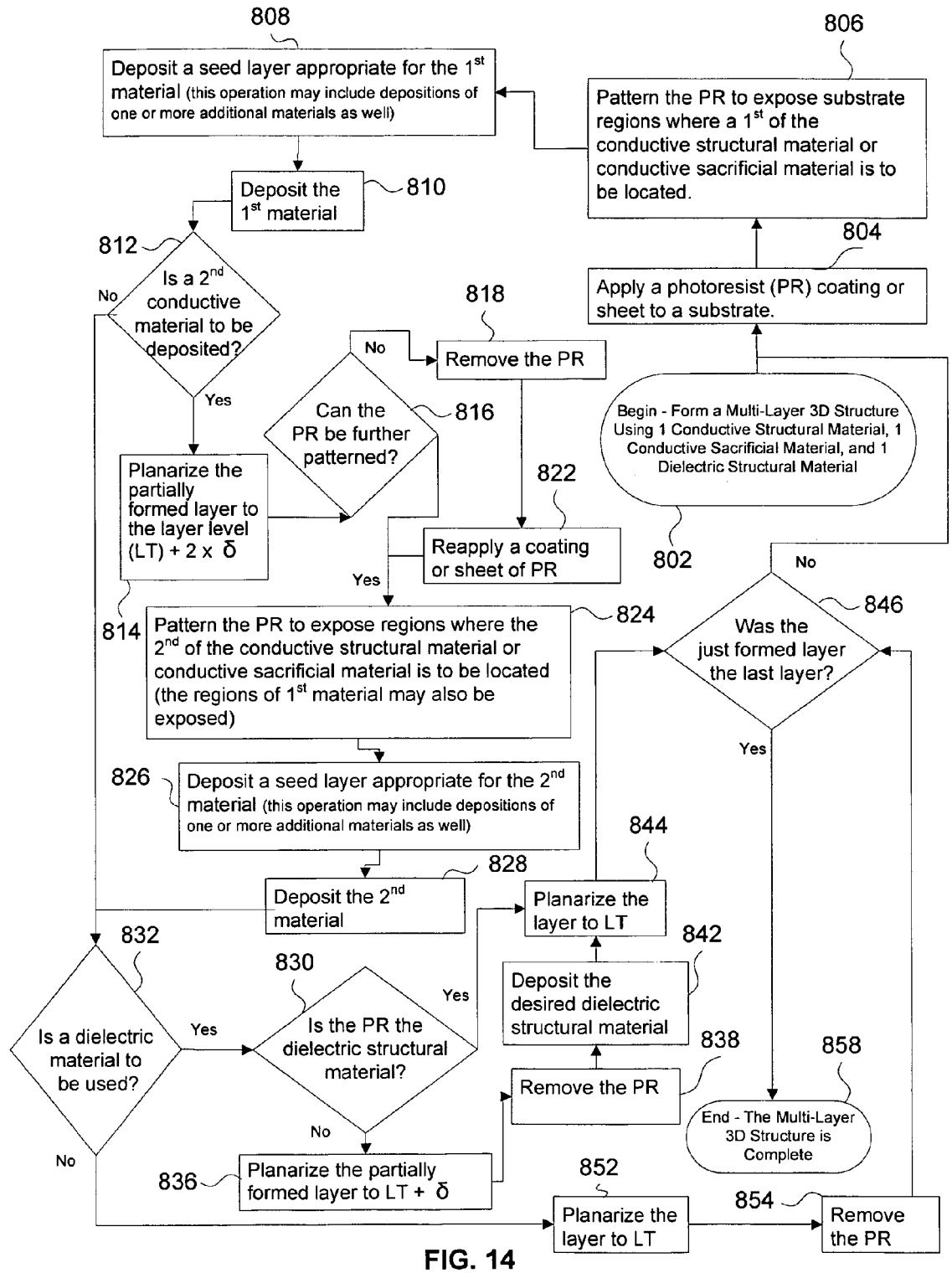
FIG. 14 provides a generalized process flowchart of a sixth embodiment of the invention which forms a three-dimensional structure from a conductive structural material, a conductive sacrificial material, and a dielectric material, wherein at least one sheet of photoresist material is used in the formation of the structure.

FIG. 14 provides a generalized process flowchart of a sixth embodiment of the invention which forms a three-dimensional structure from a conductive structural material, a conductive sacrificial material, and a dielectric material, wherein sheets of photoresist material are used in the formation of the structure. The process of FIG. 14 does not require each of the three materials to exist on each layer and as such, the flowchart includes decision blocks that allow some operations to be skipped.

The process of FIG. 14 begins with element 802 after which it moves forward to block 804 which calls for the application of a photoresist coating or sheet to a substrate after which the process moves forward to block 806 which calls for the patterning of the photoresist such that regions on the substrate where a first conductive structural or sacrificial material is to be located are exposed.

From block 806 the process moves forward to block 808 which calls for the deposition of an appropriate seed layer for the first material. Next the process moves forward to block 810 which calls for the deposition of a first material.

Next the process moves forward to decision block 812 which inquires as to whether a second conductive material is to be deposited. If the response is "no" the process moves forward to block 832 which inquires as to whether or not a dielectric material is going to be used as part of the final structure. If a positive response results from this inquiry the process moves to block 830 which will be discussed further herein later. If a negative response results from this inquiry, the process moves forward to block 852 which calls for the planarization of the layer to a height equal to that of the layer thickness after which the process moves forward to block 854 which calls for the removal of the photoresist. Then the process moves forward to block 846 which will be discussed herein later. The flow from blocks 812 to 832 to 852 and to 854 result in the formation of a layer or partial layer from a single material.

If the inquiry of block 812 produces a positive response, the process moves forward to block 814 which calls for planarizing the deposited material and photoresist to a height equal to the layer thickness plus twice an incremental amount $\delta$ (where $\delta$ is equal to or greater than a tolerance associated with the planarization operation). Next the process moves forward to decision block 816 which inquires as to whether or not the photoresist may be further patterned. If the answer to this inquiry is "no" the process moves forward to block 818 which calls for the removal of the photoresist then to block 822 which calls for reapplication of photoresist after which the process moves forward to block 824. If the inquiry of block 816 produces a positive response the process moves forward, as it did from block 822, to block 824. Block 824 calls for the patterning of the photoresist material to expose those regions where a second conductive material is to be located. This patterning operation may also expose, leave exposed, or leaved covered regions on the first conductive material as any deposits above the first conductive material will eventually be planarized in any event.

From block 824 the process moves forward to block 826 which calls for the deposition of a seed layer which is appropriate for use with the second conductive material. From block 826 the process moves forward to block 828 which calls for the deposition of the second conductive material.

From block 828 the process moves forward to decision block 832 as it did from a negative response to the inquiry of block 812. A negative response to the inquiry of block 832 causes the process to move to block 852 as discussed previously.

A positive response to the inquiry of decision block 832 sends the process to decision block 830 which inquires as to whether the photoresist material is the dielectric structural material. A positive response to this inquiry causes the process to move forward to block 844 which will be discussed herein later, whereas a negative response to this inquiry causes the process to move forward to block 836 which calls for the planarization of the partially formed layer to a height equal to that of the layer thickness, LT, plus an incremental amount $\delta$.

From block 836, the process moves forward to block 838 which calls for the removal of the photoresist material and then on to block 842 which calls for the deposition of a desired dielectric structural material. From block 842, as from a positive inquiry from block 830, the process moves forward to block 844 which calls for the planarization of the deposited materials to a height equal to that of the layer thickness, LT.

From block 844 the process moves forward to decision block 846 as it did from block 854. Block 846 inquires as to whether the just formed layer was the last layer. A positive response to this inquiry sends the process to block 858 which ends the process whereas a negative response to this inquiry directs the process back to block 804 so that one or more additional layers may be added.

Various alternatives to the embodiments described above are possible. For example, in embodiments where the substrate is conductive or where the previously formed layer is sufficiently conductive, it may not be necessary to use a first seed layer since deposition into the voids in the dielectric may be possible without the seed layer. In these embodiments sufficient conductivity of the substrate or previously formed layer may be defined in different ways. For example, sufficient conductivity may be defined to exist only when all regions where the first conductive material is to be deposited overlay conductive material and wherein conductive paths in the previous layer or substrate connect all the separate regions together or to external contact regions where electrical contact between the structure, substrate, or previous layer will be made.

In other embodiments, sufficient conductivity may be defined to exist when conductive material exists on the substrate or previously formed layer in most locations where conductive material is to be deposited and where depositions to those conductive regions will bridge gaps (i.e. via mushrooming) across dielectric material to completely fill in the voids or to connect separated conductive regions together. In other words, in some embodiments sufficient conductivity may be considered to exist even though small gaps of dielectric material exist or relatively small regions of dielectric must be initially bridged by the in-plane spreading of the conductive material which can be made to occur in a timely manner and in the effective manner for yielding depositions of desired configuration and height.

In other embodiments it may be possible to work with a single dielectric and single conductive material (e.g. structural or sacrificial material) on some layers while on other layers it may be possible only to work with structural and sacrificial conductive materials.

In still other embodiments more than one conductive structural material may be used, more than one conductive sacrificial material may be used, and/or more than one dielectric structural or sacrificial material may be used. The extension of the dielectric repatterning operations, dielectric removal and replacement and repatterning operations, and the seed layer application operations to third, fourth, or even more materials, may involve a simple extension of the techniques used in preparing to deposit the second conductive material. Selected additional patterned dielectrics may be deposited without a need to pre-deposit a seed layer.

In still other embodiments data processing and masking techniques may be used to limit seed layer formation to occur only over dielectric material or such that it overlays conductive material only slightly such that dielectric material is not located between successive layers of conductive structural material and/or between successive layers of conductive sacrificial material.

In still other embodiments it may be possible to place seed layer material only over dielectric material and to leave a zero gap or slight gap between the conductive material and the seed layer material where such a gap can be readily bridged during plating operations to cause deposited conductive material to overlay the conductive material regions on the previous layer as well as to overlay seed layer regions on the present layer.

In still other embodiments, the definition of which material is the first conductive material and which material is the second conductive material may be changed from layer-to-layer as desired so that on some layers the sacrificial material may be deposited first while on other layers the structural material may be deposited first.

In other embodiments where two conductive materials are to be deposited, it may be possible to avoid a second patterning operation of the dielectric material or to avoid removing, reapplying and then patterning a second dielectric material. In such alternative embodiments, it may be possible to initially pattern the dielectric material to form voids that represent the union of the locations where the first and second conductive materials will be deposited. After which a seed layer for the first conductive material may be applied, the first conductive material may be applied to fill all voids, and then the deposit(s) may, optionally, be trimmed (e.g. planarized) to a desired level. Next a mask may be overlaid on the surface of the first conductive material. Voids may exist in the mask at the time of mating the masking material to the previously deposited materials. Alternatively, the voids may be formed in the masking material after mating has occurred. The mask may, for example, be of the contact or adhered type. The voids in the mask preferably correspond to locations where a second conductive material is to be located. Etching of the first conductive material may occur to a desired depth and even exposed seed layer material may be removed (and potentially other associated materials as well). If the seed layer is to be removed, it may be removed by the same process (e.g. etchant) as is used for removing the conductive material or alternatively it may be removed by a different process (e.g. etchant). Next, with or without removing the masking material that was used for etching, the second conductive material may be deposited and if necessary prior to that deposition, a seed layer material or seed layer stack of materials appropriate for the second conductive material may be deposited. After deposition of the second conductive material, the mask may be removed (if not already removed) and planarization of the surface may occur to remove any seed layer material or seed layer stack materials located above the first conductive material and to bring the net layer height to a thickness equal to that of the layer thickness.

Techniques for forming structures using etching operations, as set forth in the above embodiment, are more fully described in U.S. patent application Ser. No. 10/434,519 filed on May 7, 2003 by Dennis R. Smalley and entitled "Methods of and Apparatus for Electrochemically Fabricating Structures Via Interlaced Layers or Via Selective Etching and Filling of Voids". This referenced application is incorporated herein by reference as if set forth in full herein. This referenced application teaches, among other things, the fabrication of multi-layer structures by depositing a first material, selectively etching the first material (e.g. via a mask), depositing a second material to fill in the voids created by the etching, and then planarizing the depositions so as to bound the layer being created and thereafter adding additional layers to previously formed layers. The first and second depositions may be of the blanket or selective type. The repetition of the formation process for forming successive layers may be repeated with or without variations (e.g. variations in patterns, numbers or existence of or parameters associated with depositions, etchings, and or planarization operations; the order of operations, or the materials deposited). Other disclosed embodiments form multi-layer structures using operations that interlace material deposited in association with some layers with material deposited in association with other layers. The techniques disclosed in this referenced application may be combined with the techniques set forth explicitly herein to derive additional alternative embodiments.

For example, in other alternative embodiments, it may be possible to interlace material deposited in association with different layers. For example, in some such embodiments, the following process flow may be used:

(1) A seed layer material may be deposited to the surface of the $(n-1)^{th}$ layer.

(2) A mask may be placed over the seed layer material and patterned to have openings where interlacing of conductive structural material is to occur. These opening presumably occupy only a portion of the regions of conductive structural material on layer n-1 but in some embodiments may occupy the entire area of the structural material on layer n-1.

(3) An etching operation may be performed to create voids in the exposed seed layer material and then into the conductive structural material. The thinness of the seed layer may be used to help ensure the etched areas do not expanded excessively in the plane of the layers.

(4) The masking material may then be removed.

(5) The seed layer material may then be removed (e.g. by chemical etching or possibly by electrochemical etching).

(6) A new masking material may be applied to the previously formed layer and it may be patterned. Openings in the masking material will exist in regions that are to receive deposition of a first conductive material. If the first conductive material is the material intended to fill the voids in layer n-1 then the masking material will not cover the regions of the holes but if the first conductive material is not intended to fill the voids, the voids will be covered by the masking material. The patterning of the masking material will be such that regions to receive a selected one of a structural conductive material or a sacrificial conductive material will be exposed. A seed layer will be deposited onto the masking material and on to the surfaces exposed by the voids in the masking material.

(7) The first of the structural or sacrificial materials may then be deposited.

(8) The layer may be planarized to a height of LT+δ, or in some alternatives, such planarization may not be necessary, e.g. where sufficient uniformity of deposit exists and where a second masking material will be added to allow selective etching through the seed layer over the dielectric or through the first deposited conductive material.

(8) The masking material may be further patterned or the first deposited material may be patterned (e.g. after application and patterning of a second desired masking material) so as to form voids for receiving the second of the conductive or sacrificial materials.

(9) A seed layer may be applied over the first and possibly second masking material, over the first of the deposited conductive materials (if not covered by second masking material and into any voids in the present layer and any voids in the previous layer that have become exposed by removal of selected portions of the first masking material.

(10) The second of the conductive materials may be deposited.

(11) The deposits may be planarized to a level corresponding to the layer thickness, LT so as to complete (at least temporarily the formation of layer n).

(12) Operations (1)-(11) may be repeated to form additional layers as necessary to complete formation of the structure or other operations may be used to complete formation of the structure.

In some alternatives to this embodiment, a seed layer may not need to be applied prior to performing an etching operation when the etching operation is not electrochemical in nature (e.g. it is merely a chemical etching operation) or if a conductive flow path already exists between the surface regions to be etched and a contact location or location on the structure or substrate which may be used for closing a circuit loop for electrochemically etching the material.

In still further embodiments, it may be desirable to not use a mechanical-type or machining-type operations (e.g. lapping, polishing, machining, fly cutting, milling or the like) to trim seed layer material from the surface of the dielectric or other conductive material which it overlays. In some embodiments etching operations may be used to remove the seed layer material. In some alternative embodiments, the etching operations may be done in a selectively manner or largely selective manner such that seed layer material is attacked and removed while causing no more than insignificant damage to any deposited conductive materials that are exposed. In other alternative embodiments, the seed layer etching process may also attack the material that was deposited above the seed layer and/or attack other exposed conductive and/or dielectric materials. In such embodiments, the coating thickness of the materials attacked by the etchant may be such that the etching is insufficient to cause the regions to fall below a desired minimum thickness (e.g. below a level corresponding to the layer thickness). After the etching operations have operated on the seed layer material, sufficiently, the deposited materials may be ready for receiving subsequent deposits and processing or alternatively a planarization operation may be used to bring the surface of the deposited material to a desired level. In some embodiments, scratching or otherwise forming openings in the seed layer may be sufficient to allow an etchant (e.g. developer or stripper) to attack the underlying dielectric material (e.g. photoresist) which may result in removal of the dielectric as well as removal of any overlying seed layer material by a lift off process. Such removal via lift off may be accompanied by ultrasonic agitation or the like.

In additional embodiments, the etching operations set forth above may be used to incorporate additional structural or dielectric materials of either the conductive or dielectric type. In some embodiments, the etching operations may be used in such a manner that at any given time only one material is being etched into. In other alternatives etching operations may cut into more than one material simultaneously. In some embodiments, the depth of etching may result in interlacing that extends to a fraction of a layer thickness, in others the depth may be greater than one layer thickness, while in still others a combination of depths may be used.

In still further embodiments, the orders of applying materials in the above described embodiments may be modified along with making appropriate changes to the processes. For example, in embodiments where a dielectric material is to be applied first, followed by deposition of conductive structural material, and then by deposition of a conductive sacrificial material, the order may be changed such that one of the conductive materials is deposited first, etched into, and then the dielectric material applied and then the other of the conductive materials deposited.

In still further embodiments, additional operations may be undertaken. For example, roughening of planarized surfaces may be used to enhance adhesion between the masking material and the surface and/or to enhance adhesion between a seed layer and the surface. As another example, various cleaning or other activation operations may be used to prepare surfaces for receiving depositions.

In some embodiments, delamination between deposited seed layers and underlying dielectric material have been observed. This has been particularly problematic when a seed layer material is deposited over extended planar regions of photoresist (e.g. photopatternable polyimide or other photoresist). More particularly this phenomenon as been observed around end-point detection pad regions which are bounded by large regions of unperturbated dielectric (e.g. flat or planar regions) and into which seed layer material does not extend. End-point detection pad regions are further described in U.S. patent application Ser. Nos. 11/029,220; 10/841,272; and 60/534,183 which are hereby incorporated herein by reference as if set forth in full. It has also been observed that similar problems to not exist within portions of layers that contain features (e.g. depressions into which the seed layer extends and into which a build material may be deposited). To the extent these problems are not adequately addressed in other ways, they may be addressed, for example, by one or more of (1) replacing a problematic dielectric with a different dielectric, (2) using a surface treatment to roughen the dielectric, selectively or globally, (3) using a chemical bonding agent containing functional groups capable of bonding to both the dielectric and the seed layer, (4) using adhesion layers on the dielectric prior to applying seed layer material, (5) avoid forming large flat sections of dielectric, e.g. break up the photoresist with indentations, (6) pattern the dielectric and replace what would otherwise be large flat regions with metal (e.g. copper) which can be removed later by, e.g. etching or dicing, (7) as opposed to using more global avoidance of large flat sections of dielectric, form lockdown structures of limited extent around likely delamination initiation zones to stop propagation of peeling should it initiate, and/or (8) in problem regions revert back to a planar seed layer approach that locates seed layer material only at the lower portions of layers as opposed to non-planar seed layer approaches that locate seed layer material not only at the bottom of layers but also above the tops of layers (which upper portion of the seed layer material will eventually be removed).

Figure 15A:
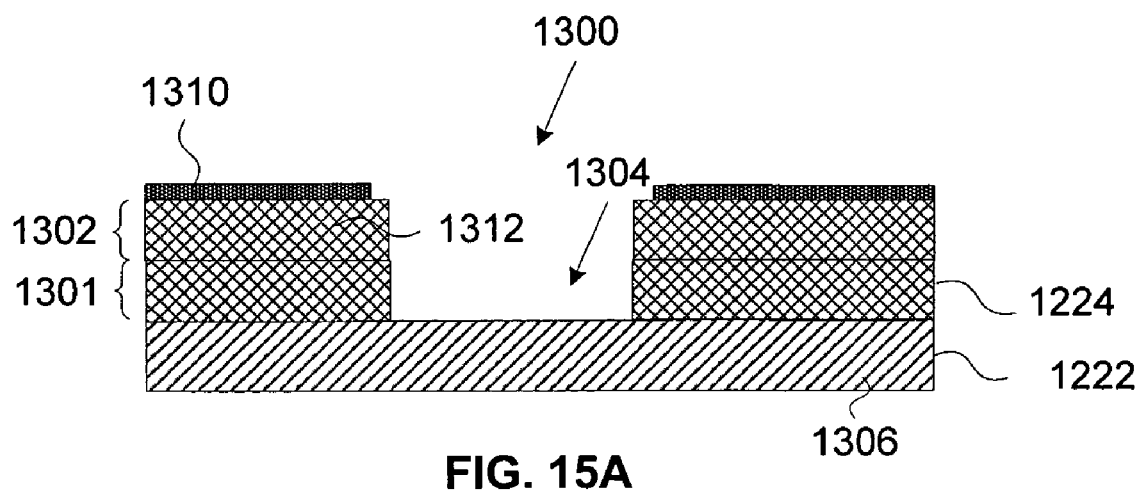
FIGS. 15A-15B provide schematic side views of a flat region of dielectric surrounding an end point detection pad and a similar region that has been modified to include anti-delamination indentations (i.e. pinking indentations).
Figure 15B:
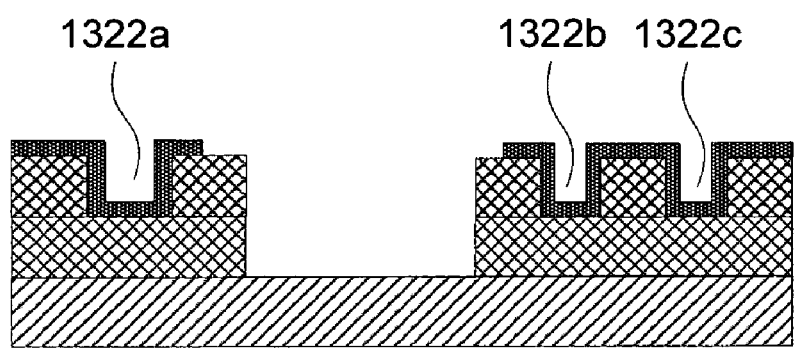

An example of approach (7) is illustrated with the aid of FIGS. 15A and 15B. FIG. 15A depicts a portion of a build 1300 around an end point detection (EPD) pad region 1304 (e.g. a region on the substrate 1306 that is intended to remain deposit free). As shown in the figure, with the exception of the EPD region, the portion of the build shown is featureless and a seed layer 1310 is located above a dielectric material 1312 of a second layer 1302. As can be seen, the seed layer does not extend down the side walls or even to the edge of EPD region. The lack of extension of the seed layer region may result from temporary masking that was used to cover the EPD region during seed layer deposition. In some circumstances, the seed layer may tend to peel away from the EPD region. This may result in some portions of the substrate that are to receive conductive deposits of material not receiving them due to an unintentional break in the conductive path. Even if deposition occurs properly, planarization operations above large flat areas may tend to peel the seed layer material from the dielectric thus causing a propagation of delamination.

The design of the build may be modified to reduce risk of propagation of delamination. An example of such a modification is shown in FIG. 15B. Around the EPD regions, indentation regions 1322a, 1322b, and 1322c may be defined in the dielectric material (i.e. openings that extend completely or partially through the dielectric material). These regions may be defined in a CAD design that represents the structure or structures to be formed or they may be formed via appropriate software or hardware implemented algorithms, or alternatively they may be implemented by hard coding or mechanical fixturing (masking and apertures) that exist in the system that pattern the dielectric material. It is believed that the existence of such contrived indentation regions (or at least seed layer indentation regions) will help to eliminate tendency of the seed layer material to peel or delaminate. In various alternative embodiments the deposition regions may take on a variety of shapes, widths, depths. They may be located in various regions, for example around EPD regions, regions that surround or shield desired build regions, electrical contact regions, and/or regions bridge the desired build regions and the electrical contact regions. In some embodiments they may be located in a global manner (i.e. in all regions where the area is larger than a defined maximum and where they may be located without damaging the desired build structures. They may consist of a single indentation ring that surrounds a desired region, or multiple rings, or other shaped barriers that may or may not form a closed loop but instead merely inhibit peeling from occurring in a particular direction or across a defined boundary or sets of boundaries. The non-structural indentions (i.e. indentations not intended to form part of final structure that is desired to be formed) discussed herein, which may result in reduced delamination of seed layers from dielectric materials, may be referred to as "pinking" indentations, which are located in "pinking" regions and their use may be referred to as "pinking" a particular layer of a build. Any structural material deposited into the pinking indentations may remain as part of a final structure (if it isn't problematic) or it may be removed using a selective etching operation, or they it be removed along with the dielectric material or sacrificial material. Such material may be located in dicing lanes on a wafer such that it is removed when individual dice are separated from one another. Pinking indentations are formed to aid in the fabrication of a structure, or device.

Pinking indentations may be considered to be formed in secondary regions of a first material (e.g. masking material or other dielectric material) as the intent of these regions is not primarily for producing structural features (e.g. either solid regions or void regions of a structure that will be put to use) but for enhancing fabrication reliability. Primary regions are those for which it is intended that structures and structural features be formed and more particularly where it is anticipated that successful formation of the structure and features will occur. As such, secondary regions or pinking indentations do not necessarily form features of a structure to be formed though in some instants they might. For example, the need for a pinking indentation, to ensure reliable fabrication may be known by a designer or person who lays out a build (i.e. define locations and structures to be formed on a given wafer or substrate during a given fabrication process) and that person may create, or locate, structures (i.e. dual purpose structures) with the intent that pinking indentations be formed and if the structures are not damaged (e.g. by peeling-type failures of seed layer material) with the intent that these structures may be put to actual use. If the purpose of the indentations is primarily for fabrication reliability purposes or if the yield of structures at what might be considered secondary regions suffers from failures associated with peeling or seed layer adhesion problems or the like (e.g. peeling which is stopped by the existence of the structures which may or may not be damaged), the indentations should be considered to located at secondary regions and to be located primarily or substantially to improve fabrication reliability for the wafer as a whole.

The techniques disclosed explicitly herein may benefit by combining them with the techniques disclosed in U.S. patent application Ser. No. 10/841,272 filed May 7, 2004 by Adam Cohen et al. and entitled "Methods and Apparatus for Forming Multi-Layer Structures Using Adhered Masks". This referenced application is incorporated herein by reference as if set forth in full herein. This referenced application teaches various electrochemical fabrication methods and apparatus for producing multi-layer structures from a plurality of layers of deposited materials where adhered masks are used in selective patterning operations.

The techniques disclosed explicitly herein may benefit by combining them with the techniques disclosed in U.S. patent application Ser. No. 10/697,597 filed on Oct. 29, 2003 by Michael S. Lockard et al. and entitled "EFAB Methods and Apparatus Including Spray Metal or Powder Coating Processes". This referenced application is incorporated herein by reference as if set forth in full herein. This referenced application teaches various techniques for forming structures via a combined electrochemical fabrication process and a thermal spraying process or powder deposition processes. In some embodiments, selective deposition occurs via masking processes (e.g. a contact masking process or adhered mask process) and thermal spraying or powder deposition is used in blanket deposition processes to fill in voids left by the selective deposition processes. In other embodiments, after selective deposition of a first material, a second material is blanket deposited to fill in the voids, the two depositions are planarized to a common level and then a portion of the first or second materials is removed (e.g. by etching) and a third material is sprayed into the voids left by the etching operation. In both types of embodiments the resulting depositions are planarized to a desired layer thickness in preparation for adding additional layers.

The techniques disclosed explicitly herein may benefit by combining them with various elements of the dielectric substrate on and/or dielectric incorporation techniques disclosed in the following patent applications (1) U.S. Patent Application No. 60/534,184 filed Dec. 31, 2003 and Ser. No. 11/029, 216 filed Jan. 3, 2005 both by Adam L. Cohen et al and entitled "Electrochemical Fabrication Methods Using Dielectric Substrates and/or Incorporating Dielectric Materials"; (2) U.S. Patent Application No. 60/533,932 filed Dec. 31, 2003 by Adam L. Cohen et al. and entitled "Electrochemical Fabrication Methods Using Dielectric Substrates and/or Incorporating Dielectric Materials"; (3) U.S. Patent Application No. 60/534,157, which is entitled "Electrochemical Fabrication Methods Incorporating Dielectric Materials", filed Dec. 31, 2003 by Lockard et al; and (4) U.S. Patent Application No. 60/533,895 filed Dec. 31, 2003 by Lembrikov et al, and entitled "Electrochemical Fabrication Method for Producing Multi-layer Three-Dimensional Structures on a Porous Dielectric". These applications are hereby incorporated herein by reference as if set forth in full.

The techniques disclosed explicitly herein may benefit by combining them with the techniques disclosed in U.S. patent application Ser. No. 10/309,521, filed Dec. 3, 2002, by Brown et al., entitled "Miniature RF and Microwave Components and Methods for Fabricating Such Components" and published as US 2003-0222738 A1 and U.S. patent application Ser. No. 10/607,931, filed Jun. 27, 2003, by Brown et al, entitled "Miniature RF and Microwave Components and Methods for Fabricating Such Components" provide examples of devices that may benefit dielectric incorporation techniques explicitly disclosed herein. These applications also provide alternative techniques for incorporating dielectrics that may be combined with the techniques explicitly disclosed herein to derive additional embodiments of the invention.

Adhered Masks by Transfer Plating

As noted previously, in some embodiments of the invention, adhered masks may be formed by transferring preformed patterns of material. In such embodiments, plating tools having raised features and recesses are formed and used to transfer a masking material, or precursor thereof, in a desired pattern to a substrate or previously formed layer. These tools may be formed in a variety of ways such as those taught in the '630 patent for forming electroplating articles (i.e. contact masks). These tools are used as master patterns for transferring patterns of solidifiable masking material to a substrate or previously formed layer. After transfer, the precursor of the masking material is allowed to solidify or is made to solidify. In some embodiments, multiple transfers of material may be made to enhance the thickness of depositions or to improve the electrochemical or chemical blocking ability of the coatings once solidified. When making multiple transfers, the same material may be transferred each time or different materials may be transferred. When making multiple transfers the previous transferred material may be allowed to, or made to, partially or completely solidify prior to a subsequent transfer. Alternatively, the subsequent transfer may be made with the previously transferred material remaining in a fluid state such that intermixing of multiple materials may occur. Such intermixing may, for example, be useful in working with masking materials that are based on two-part chemical systems (e.g. some epoxy systems). In some embodiments, the transferred material(s) may function as build material(s) in combination with other deposited material(s) while in other embodiments they may solely function as mask materials. When functioning as build materials they may be used as structural materials or as sacrificial materials.

Transferred materials will preferably offer adequate adhesion to the substrate and previously deposited materials such that transfer can readily occur and such that after solidification masks of adequate structural integrity are obtained. They will preferably be adequately compatible with electrodeposition and/or etching baths as well as plating and/or etching operations that will be employed during the time that the masking material is present such that entire layer thicknesses may be deposited and/or sufficient depths etched without need for replacing the mask. In some embodiments the replacement of masks may be acceptable. The materials are preferably compatible with optimal cleaning solutions and processes as well as with activation solutions and processes, and the other build environments and processes to which they may be subjected. In embodiments where deposition of adhesion layer materials and seed layer materials will be applied to the masking material or the masking material applied thereon, the masking material(s) are to be compatible with such materials. In some embodiments, preferred masking materials may be dielectrics while in other embodiments masking materials may be conductive materials. In some embodiments structural materials and/or sacrificial materials may need to be separable from the masking materials while in other embodiments such ability to separate may be unnecessary. Separation may occur by a variety of operations (e.g. heating to melt, chemical dissolution, electrochemical separation, breakdown by exposure to radiation, burning out, and the like.

Precursor masking materials once transferred may become solidified masking materials by a variety of processes, such as curing (e.g. polymerization by exposure to radiation, e.g. UV, or heat), phase change by lowing or raising temperature, and/or solvent removal (e.g. evaporation), or the like. In still other embodiments, colorants or other additives may be included in the masking, materials for a variety of reasons.

A seventh embodiment uses transferred masking material that is a dielectric (e.g. a wax, a photopolymer, a thermoset polymer, or the like, and uses first and second conductive materials as building materials. Herein the term "ink" will be periodically used in a generic fashion to refer to a precursor or unsolidified masking material. The first operation in the process is to transfer a liquid, paste-like, or gelatin-like masking precursor material to a surface of the substrate (or previously formed layer). The transfer occurs in a patterned manner using a patterned transfer tool having raised areas (e.g. plateaus or lines) and recessed areas (e.g. valleys or trenches). The patterned tool in some variations of this seventh embodiment may take a form similar to that of the electroplating articles described in the '630 patent but in the present process such "articles" or tools are not used for plating but instead are used as patterns for transferring selective patterns of the precursor masking material. In this embodiment, the plateaus of the tools are contacted to a volume of the precursor material whereby the plateaus pick up the precursor material while the valleys do not. The tool having the precursor is then translated and/or rotated to a desired transfer position relative to the substrate whereby the patterned precursor is contacted to the substrate and transferred to the substrate in a pattern dictated by the tool patterning. In the present embodiment the substrate is assumed to be conductive and though in other embodiments it may be a dielectric and a seed layer may be used to make it platable.

In a second operation the transferred precursor masking material is allowed to, or forced to solidify, and to thereby become the masking material. Depending on the precursor selected, transformation from the liquid, gel-like, or paste-like state may occur by allowing or forcing solvent evaporation, allowing or forcing a chemical reaction between constituents of the precursor or between the precursor constituents and one or more additional materials applied to the precursor. Depending on the precursor being used, the forcing mechanism may include one or more of time; heat (e.g. via elevated temperature); reduced partial pressure (e.g. application of a vacuum); increased pressure; exposure to radiation such as UVR, IRR, visible light, X-rays, electron beams, and the like; increased pressure; and/or removal of inhibition agents (e.g. the removal of oxygen from a free radical curing system). In variations of this embodiment, this second operation may occur after separation of the transfer tool from the precursor material or it may occur while the transfer tool remains in contact with the precursor/masking material.

If necessary, a third operation may be performed to remove small quantities of masking material from undesired locations. Depending on how transfer has occurred, small quantities of masking material or precursor material may be left at undesired locations on the substrate or previously formed layer. This operation may be performed by an etching operation that is tailored to the particular precursor, masking material, substrate material, and build materials that may be present. The etching operation may be performed for a controlled amount of time with an etchant concentration or quantity and at a temperature that will remove the unwanted precursor or masking material without significantly damaging the substrate, previous layer, or masking material that is properly located. This etching operation may also remove any adhesive or chemical that may have been used in the process of achieving a successful transfer. In some alternative embodiments, the original configuration of the transferred material may be modified from a desired configuration so as to compensate for any dimensional changes that occur as a result of this type of removal operation.

The fourth operation of this seventh embodiment involves the deposition of a first building material. In this embodiment the building material is conductive and is deposited via electroplating. In alternative embodiments, however, other types of materials may be used (e.g. dielectrics) and the deposition may be performed in a different manner, for example by electroless plating, electrophoretic deposition, spraying, sputtering, spreading, or like. The deposition in one sense may be considered a bulk deposition but in another sense it may be considered a selective deposition as a result of the dielectric mask material acting as a barrier to the electroplating of the first building material.

The fifth operation of this seventh embodiment removes the masking material from the substrate, or previously formed layer, and from the edges of the first building material. This removal may occur in a variety of ways depending on the masking material used, the first material, the material of the substrate, and/or how the materials of the previous layer will be exposed by the removal process. The removal may occur by, for example, dissolving the masking material in a solvent, reducing adhesion between the mask material, the substrate and the first building material, burning out the masking material, using high temperature or pressure steam, mechanical abrasion, or the like.

If needed or desired, a sixth operation may involve another removal operation. This removal operation is intended to remove any small or thin unwanted regions of the first building material that were deposited. This operation may take the form of a flash etching operation. Such small or thin regions may result from small holes in the masking material or from plating into thin voids that may exist between portions of the masking material and the substrate.

The seventh operation of this seventh embodiment deposits a second building material, which is conductive. In this embodiment the deposition occurs by electroplating. In alternative embodiments, other deposition choices and material types are possible.

The eighth operation of this embodiment planarizes the deposited material down to a level that bounds the present layer. In this embodiment, the planarization operation is by lapping but in other embodiments the planarization operation may take other forms such as, for example, chemical mechanical polishing (CMP) milling, fly cutting (diamond), or other machining operations. This operation completes formation of the layer.

Next the first through eighth operations are repeated one or more time to form a structure from a plurality of adhered layers and thereafter one of the two materials may be separated from the other so as to release a structure of desired material and configuration.

In some alternative embodiments, structures may be formed using operations 1-8, as described above, to form some layers while other operations, or other orders of operations, may be used to form other layers.

In some alternatives to the seventh embodiment the precursor material may be cured or solidified prior to contacting it to the substrate in a transfer process. In still other alternatives, the surface of the masking material and/or the substrate (or previously formed layer) may be treated to enhance the affinity or adhesiveness between the masking material and the substrate (or previously formed layer). Such treatment may, for example, roughen the surface of the substrate, it may enhance the chemical reactivity of one of the surfaces relative to the material of the other surface, it may apply an adhesive (e.g. a contact adhesive), or the like to one or both surfaces. If additives are placed on the surface of the substrate (or previous layer) in a blanket manner, a cleaning or etching operation may be necessary to ready the surface for acceptance of a material to be deposited.

In some alternative embodiments, the precursor masking material may be spread over the plateaus and into the valleys and then wiped from the plateaus, where after the tool may be contacted to the substrate and the precursor material transferred from the valley to the substrate. In these embodiments the surface of the tool may be made to have less affinity for the precursor material than the precursor material has for the substrate (and previously formed layers). Alternatively, the precursor material may be cured prior to separating the tool and the substrate whereby the masking material (cured precursor material) adheres better to the substrate than to the tool thus enhancing the probability of a successful transfer. In some embodiments, the face of the tool or the support for the tool may be flexible which may be useful in aiding the transfer process.

In some alternative embodiments, where mask thickness is less than a desired layer thickness, and where multiple stamping operations will be used to increase the mask thickness, the multiple stamping operations may be performed with different sized masks, or with a single mask stamped multiple times at slightly offset positions. Such variations in sizing or offsetting in position may provide a taper or finer stair step to the sidewalls of the mask which in turn may be of use in helping to reduce layer-to-layer discontinuities in the deposited materials. Such inter-layer discontinuity reduction is discussed further in U.S. patent application Ser. No. 10/830,262, entitled "Methods of Reducing Interlayer Discontinuities Electrochemically Fabricated Three Dimensional Structures", filed Apr. 21, 2004, by Cohen et al.

In some alternative embodiments, instead of using a transfer tool having a contour surface (i.e. plateaus and valleys), a substantially planar mask or cylindrical mask may be used wherein the surface of the mask is treated, or the mask may be composed of different materials, such that different regions have different affinities or aversions to the precursor material. Such a surface may be capable of holding a precursor at selected locations for transfer while other portions of the surface cannot.

Figure 16A:
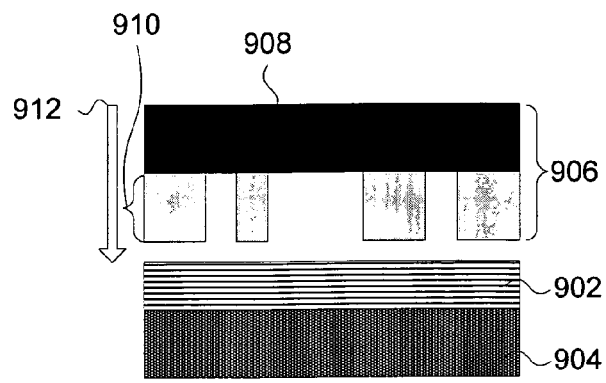
FIGS. 16A-16Q schematically depict side views at various stages of an implementation of a seventh embodiment of the invention as applied to the formation of a multi-layer structure.
Figure 16B:
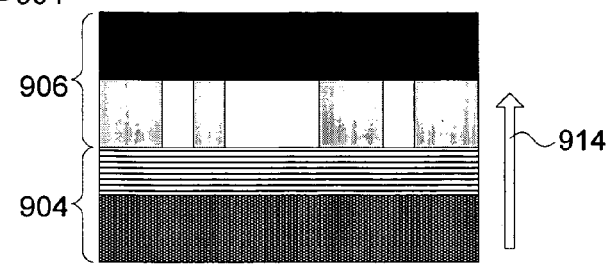
Figure 16C:
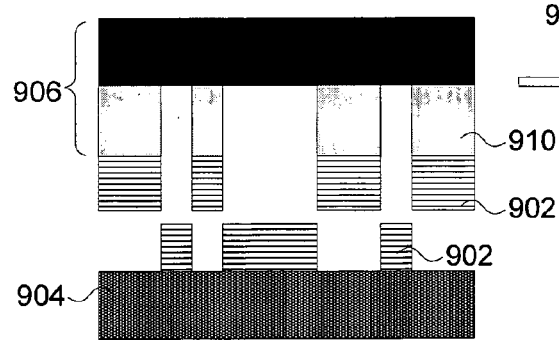
Figure 16D:
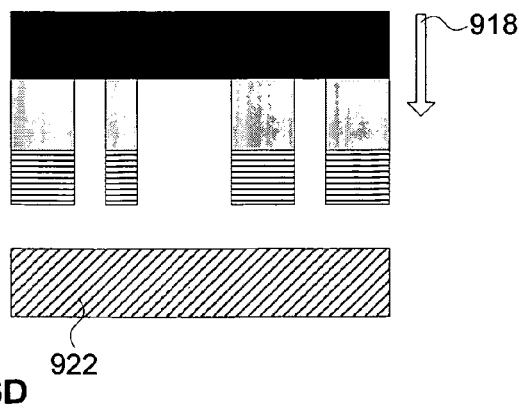
Figure 16E:
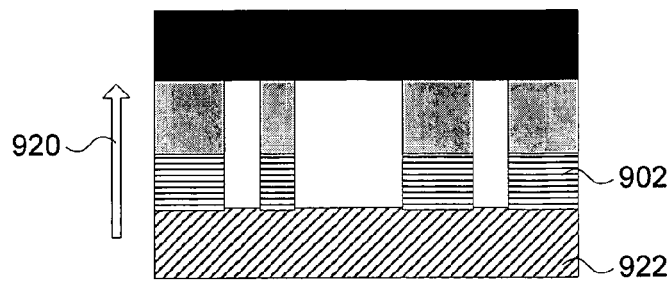
Figure 16F:
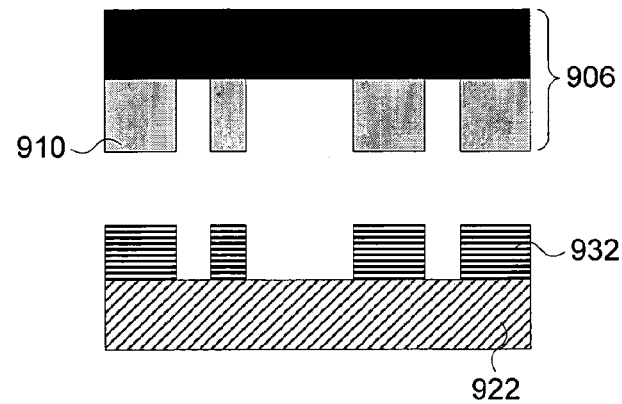
Figure 16G:
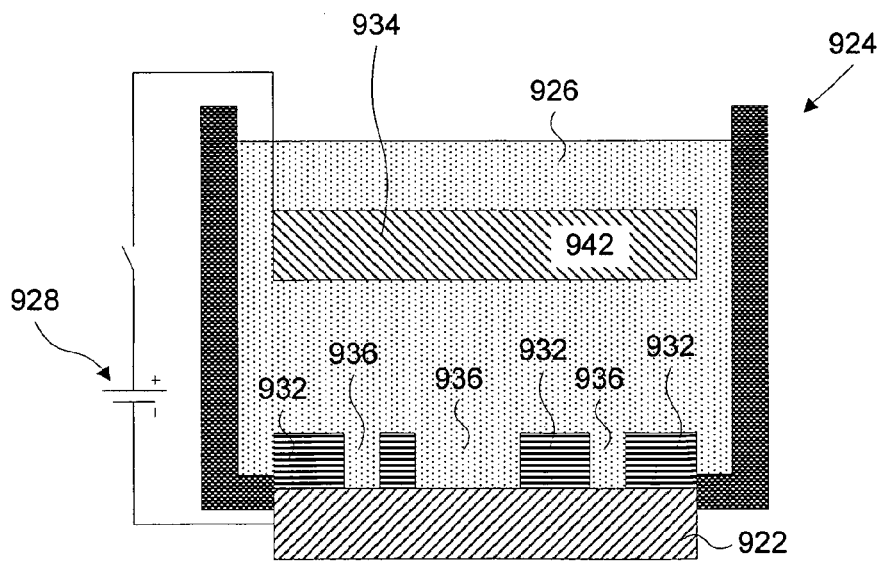
Figure 16H:
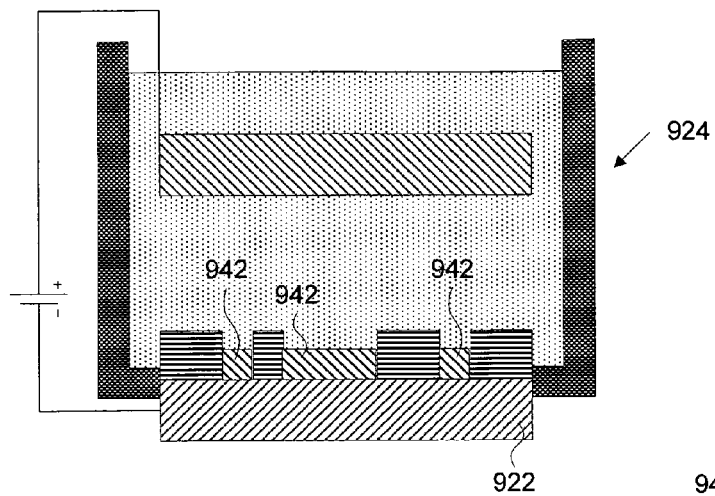
Figure 16I:
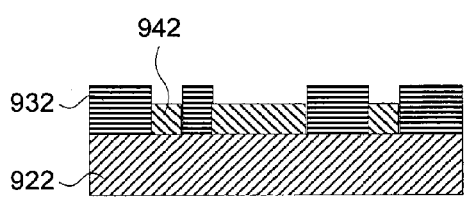
Figure 16J:
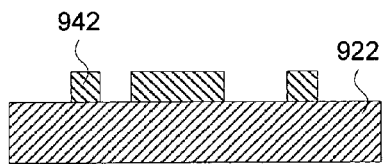
Figure 16K:
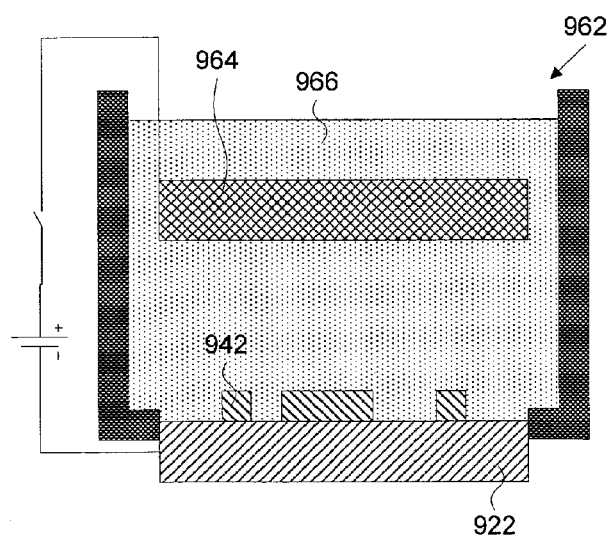
Figure 16L:
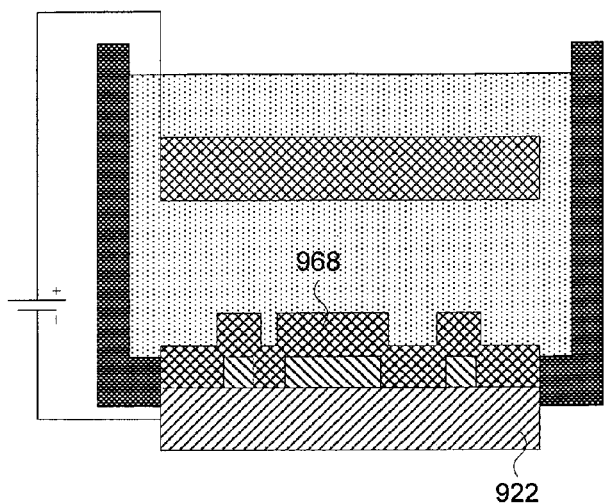
Figure 16M:
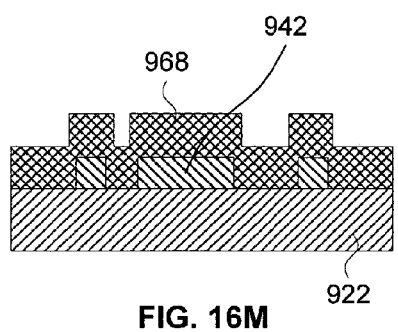
Figure 16N:
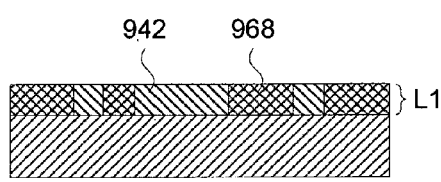
Figure 16O:
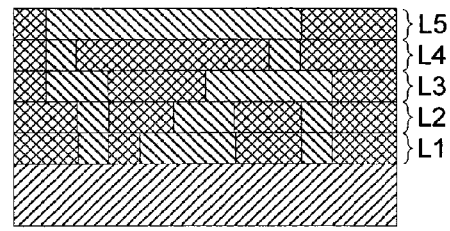
Figure 16P:
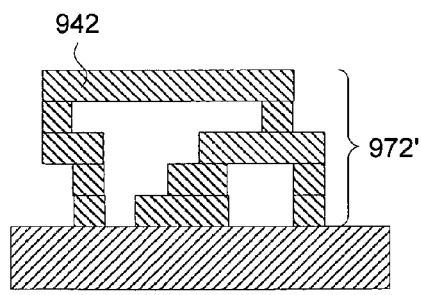
Figure 16Q:
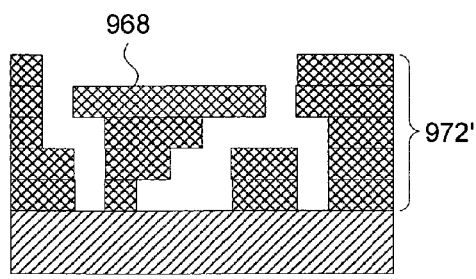

FIGS. 16A-16Q schematically depict side views at various stages of an implementation of the seventh embodiment as applied to the formation of a multi-layer structure.

FIG. 16A depicts an ink (precursor masking material) 902 located on a support 904. A patterned transfer tool 906 includes a support 908 and a patterned portion 910. The patterned portion 910 is moved in the direction of arrow 912, relative to the support and the ink, until contact between the patterned portion 910 and the ink 902 is made.

FIG. 16B depicts the state of the process where contact between the patterned portion 910 and the ink has been made. After contact, the transfer tool 906 is moved, relative to the support 904, in the direction of arrow 914.

FIG. 16C depicts the state of the process after the separating has occurred. As shown in FIG. 16C, the portion of the ink 902 that contacted the patterned portion 910 of the tool 906 preferentially adhered, at least temporarily, to the patterned portion 910. After completion of movement in the direction of arrow 914, the tool 906 carrying ink 902 is moved in the direction of arrow 916, relative to a substrate 922, in order to position the tool 906 over the substrate 922. The substrate 922 is the substrate onto which the multi-layer structure will be formed.

FIG. 16D depicts the state of the process after the movement along the direction of arrow 916 is completed and movement in direction of arrow 918 begins.

FIG. 16E depicts the state of the process after movement in direction 918 is completed and the ink is made to contact the substrate 922. After making contact, the tool 906 moves in the direction of arrow 920, relative to the substrate 922.

FIG. 16F depicts the state of the process after movement in direction 920 is completed. As a result of the contact between ink 902 and substrate 922 and then the separating of the tool and the substrate, the ink preferentially remains on or adheres to substrate 922 and becomes separated from tool 906. FIG. 16F also shows that ink 902 has been converted to masking material 932 due to a transformation (e.g. polymerization, freezing, or the like). The transformation may have occurred prior to the separation of transfer element 906 from support 922 or may have occurred thereafter.

FIG. 16G schematically depicts the substrate 922 located within a plating tank 924. The plating tank includes an anode 934 which includes a desired material 942 that is to be deposited onto the substrate 922. The plating tank also includes a plating bath 926 that is appropriate for transferring material from the anode to the substrate which is biased as a cathode by power supply 928. When appropriately biased and current flow initiated, material 942 will be electroplated from an anode 934 through plating bath 926 onto substrate 922 via openings 936 through masking material 932.

FIG. 16H depicts the state of the process after deposition of a first building material 942 onto the substrate 922 occurs.

FIG. 16I depicts the state of the process after the substrate 922 and partially formed first layer are removed from plating tank 924.

FIG. 16(j) depicts the state of the process after separation of the masking material 932 from the substrate 922 which leaves behind a patterned deposit of material 942.

FIG. 16K depicts the state of the process after loading the substrate and partially patterned first layer into plating station 962. The plating station 962 includes an anode 964 composed of a second material to be plated and contains a plating solution 966 which will be used to transfer ions of the second material from anode 964 to substrate 922 and to regions on the first deposited material 942. (assuming they are not shielded in same manner).

FIG. 16L depicts the state of the process after deposition of the second building material 968 onto the substrate and the patterned deposit of material 942 while FIG. 16M depicts the state of the process after removal of the substrate and deposited materials from plating tank 962.

FIG. 16N depicts the state of the process after the first layer L1 is completed by planarizing the deposited materials down to a level that bounds the first layer.

FIG. 16O depicts the state of the process after deposition of four more layers completes the formation of the layers of sample structure 972 or 972'.

FIGS. 16P and 16Q depict alternative states of the process after one of the materials 942 or 968 has been removed and the structure 972 or 972' of desired material and configuration is released.

FIGS. 17A-17D schematically depict side views of various states of an alternative process that involves rolling a cylindrical support carrying a pattern of ink across a substrate for transferring the ink to the surface of a substrate in preparation for depositing layers of a structure on the substrate.

Figure 17A:
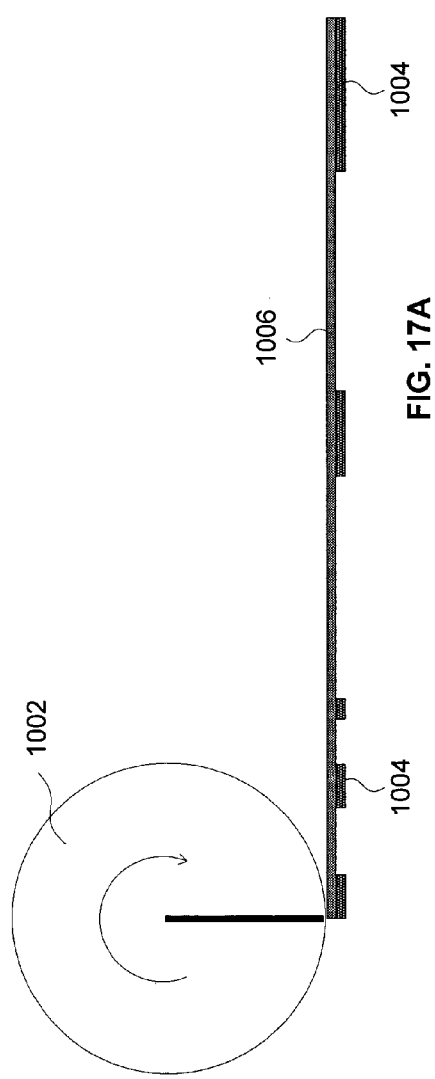

FIG. 17A depicts a cylindrical support 1002 being brought into contact with a backing sheet 1006 for an ink 1004 which it holds in position. The cylindrical support is loaded with the ink by rolling across the backing material. The pattern of ink may have been deposited to the backing material by inkjet dispensing, selective extrusion, photoresist (e.g. dry film) exposure and development, or by any other appropriate manner. In an alternative embodiment, the patterning of the ink with or without a backing material may have occurred directly onto the cylindrical support.

Figure 17B:
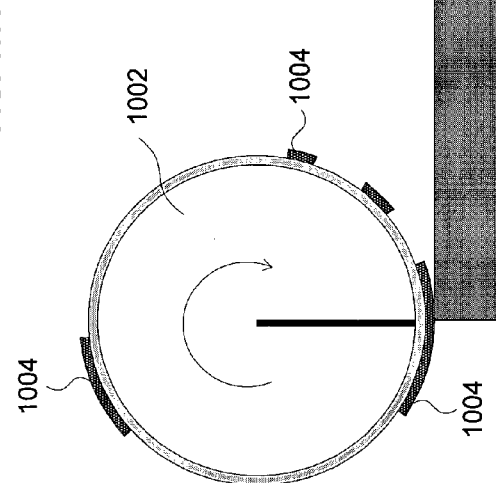

FIG. 17B depicts the state of the process after the masking material and backing sheet 1006 are loaded onto support 1002 and support 1002 is placed in an initial position above an edge of substrate 1012 in preparation for rolling the ink onto the substrate.

FIG. 17C depicts the state of the process after cylindrical support 1002 has rotated about half way across the surface of the substrate in the process of depositing, or transferring, ink to the substrate. FIG. 17C illustrates that a portion of masking material 1004 has been deposited. Before, during, or after transfer, ink 1004 may undergo treatments that cause it so become masking material 1014, and if transformation occurs before transfer material 1014 or a surface of substrate 1012 may be treated to enhance adhesion of the material 1014 to the substrate surface. FIG. 17C depicts a portions of ink 1004 has been transfer and become material 1014 while additional ink 1004 has not yet been transferred.

FIG. 17D depicts the state of the process after rotation of support 1002 across the surface of the substrate has been completed and all of ink 1004 has been transferred to the substrate 1012 and has become selectively patterned masking material 1014. At this point, the masked substrate is ready for receiving a selective deposition of a first building material as described herein previously with regard to the first embodiment and its various alternatives.

FIGS. 18A-18E schematically depict an alternative embodiment for transferring a patterned ink from a cylindrical support 302 to a substrate 312. In this embodiment a backing material 306 does not remain adhered to the support when the ink material 304 transfers to the substrate but instead the backing material is also transferred along with the ink.

Figure 18A:
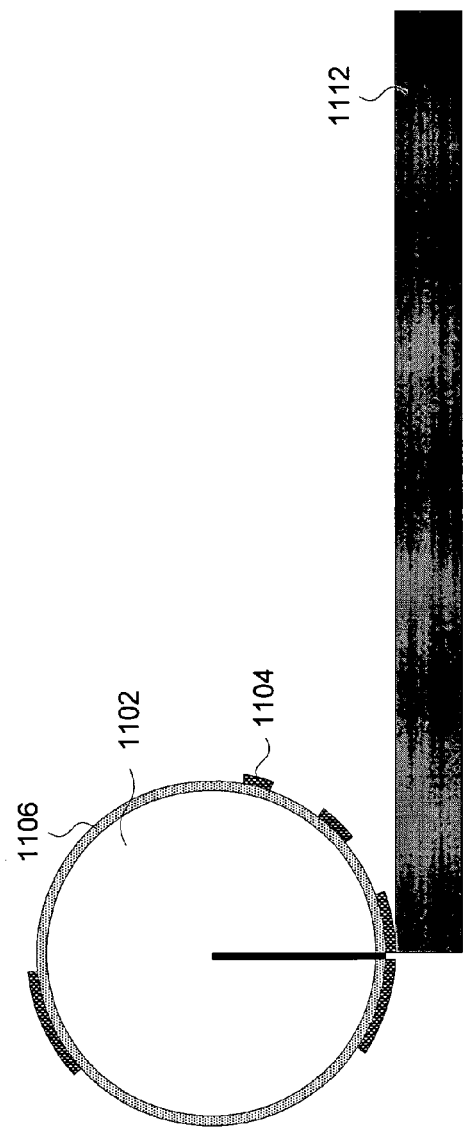

FIG. 18A depicts a beginning point of the process where a cylindrical roller 1102 has on its surface a backing material 1106 on which a patterned ink 1104 is located. The ink may be in a paste-like state or semisolid or even solid state. The cylindrical support is positioned relative to the substrate 1112 such that transfer of ink can begin.

Figure 18B:
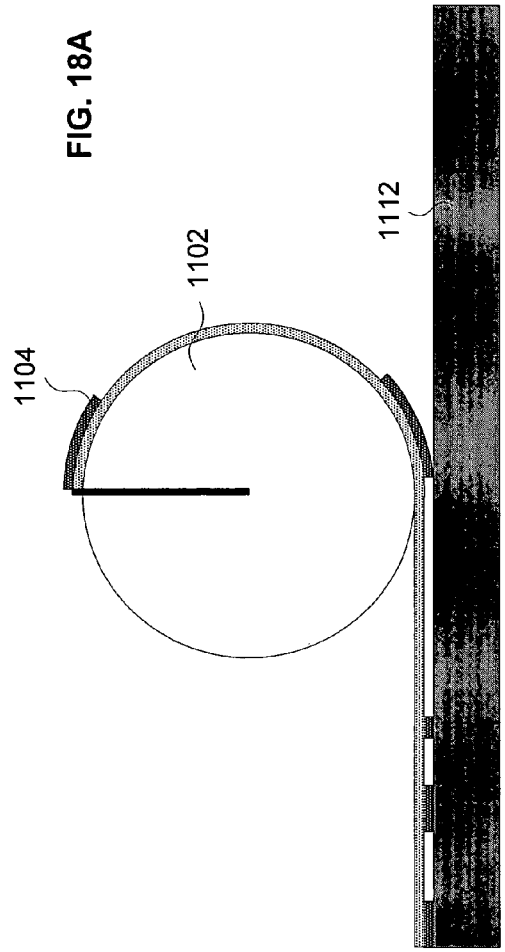

FIG. 18B depicts the state of the process after a portion of the ink has been transferred from the support to the substrate along with a portion of the backing material by rolling the support across the surface of the substrate.

FIG. 18C depicts the state of the process after the rotation of cylindrical support 1102 relative to substrate 1112 has resulted in the complete deposit of the patterned ink 1104 and the backing material 1106 onto the substrate.

FIG. 18D depicts the state of the process after the ink 1104 has been transformed into masking material 1114. In this example, the transformation occurs prior to separating the backing material 1106 from the ink/masking material. In other embodiments transformation may occur before transfer and thereafter adhesion may be made to occur.

FIG. 18E depicts the state of the process after the backing material 1106 has been removed from the masking material 1114 such that the patterned substrate is ready to receive deposition of a first building material as described herein previously with regard to the first embodiment and its various alternatives.

An eighth embodiment starts with a metal substrate on to which an ink is transfer plated (i.e. using a transfer tool) to form a pattern of the conductive material (i.e. plateaus) through which voids or valleys exist. In this embodiment, as well as the other embodiments presented herein, the transfer process and deposition processes to follow may be performed in any orientation (upward, downward, sideways or any combination). The transfer operations may be performed as described in association with the seventh embodiment or one of its alternatives, or in some other manner that will be apparent to those of skill in the art upon reviewing the teachings herein.

As in the seventh embodiment, if necessary, the transferred material may be given time to transform (e.g. to dry) or alternatively it may be made to solidify (e.g. by application of heat or radiation, or the like). As in the seventh embodiment, it may be made to flow by application of heat, or by other techniques, for example, to help fill in any micro-voids in the ink that may carry over to the masking material. In some embodiments, drying or solidification may be allowed to occur several times before a completely coated area is obtained. If the deposition height is not at least as great as one layer thickness (LT), transfer and potentially transformation may be repeated multiple times to build up the thickness. In this repetition process the transformation operations may be performed after every transfer, not performed at all, performed after a selected number of transfers, or performed only after the last transfer.

Once the mask height is at least as great as the layer thickness and preferably somewhat greater, a blanket electrodeposition of a second material is performed. The blanket deposition may be performed as a single operation or in a plurality of operations (e.g. depositions separated by intermediate short etching operations) to fill the valleys formed by the masking material on the substrate. The filling eventually reaches a depth at least as great as the layer thickness and potentially somewhat greater. The plateaus of masking material may also receive a deposition of the second material as the plateaus are formed of conductive material.

Next a planarization operation is used to yield a first layer of the structure which has an upper surface which bounds the first layer. The first layer consists of the masking material (i.e. a first material) and the second material, each located on different portions of the substrate.

Next, operations of mask formation (e.g. transferring, transforming, repeating, and the like), electrodeposition, and planarization are repeated a plurality of times to form a plurality of adhered layers.

After layer formation is complete, one of materials may be removed to yield a released structure of desired material and configuration.

In an eighth embodiment, a multi-layer three-dimensional structure is formed from a plurality of adhered layers where one conductive material is electrodeposited, where the transferred ink/masking material is a dielectric material, and where a second building material is deposited which is also a dielectric. This embodiment includes seven primary operations that are repeated a plurality of times in forming a multi-layer structure.

The primary operations of this eighth embodiment include (1) depositing a seed layer, if necessary, and an adhesion layer, if necessary, onto a substrate which may include previously deposited layers of material and which may be a dielectric, (2) formation of a mask by transfer plating ink and then allowing it to solidify or cure, (3) depositing a first conductive material, e.g. via electrodeposition, into voids in mask, (4) removing the mask, (5) removing the exposed adhesion/seed layer that is located between the regions where the first conductive material was deposited, (6) depositing a second material which is a dielectric by, for example, electrophoretic deposition, spreading, spraying, sputtering, and the like, and (7) planarizing the deposited materials to form a first layer of the structure. Next the process repeats operations (1)-(7) a plurality of times to complete layer formation and thereby build up a multilayer structure. After all layers are formed, and if desired, one of the first or second materials may be separated from the other to release a structure of desired material and configuration. Alternatively the combination of a conductive and dielectric structure may be used without a release.

Direct Fabrication of Masks

In the some embodiments of the invention, masks may be generated directly from computer data. In some of these embodiments computer controlled selective deposition devices are used to deposit material to selective regions in the form of droplets (e.g. via one or more ink jet heads or the like) or in the form of one or more modulated streams of material (e.g. extrusion devices or the like). By use of these devices, computer data may be used to directly form masks into which one or more other materials may be deposited. In some embodiments, the dispensed material(s) may function as build material(s) along with the other deposited material(s). Such use of these methods allow desired structure formation to occur without the need for tooling (e.g. photomasks or the like) to form masking structures.

Ink jet devices useful in some embodiments may take on a variety of forms. Devices may be, for example, of the piezoelectric driven type or of the thermally driven type. Devices (print heads) may have a single orifice, a multi-orifice head, or multiple multi-orifice heads. Positioning of the device relative to the substrate or previously formed layers may occur via movement of the print head, or movement of the substrate or a combination of the two. Data that drives the relative positioning of the print head and/or the dispensing of droplets may be cross-sectional data supplied directly or it may be data derived from a three-dimensional structure and associated build volume (i.e. combination of the desired three-dimensional structured and surrounding region that is to be occupied by other build material). The data may be modified to enhance the accuracy of the structure being formed. For example, it may be modified to compensate for the width of the droplets that are being dispensed or to compensate for size differences resulting from temperature differentials at dispensing temperatures, plating temperatures, and use temperatures, and the like. During the formation of a given mask, the mask may be formed from a single level of drops or from overlaid and even offset drops. In boundary regions, if multiple overlaid drops are required, the drops may be dispensed to positions which are offset to the midpoints of previously dispensed droplet locations to smooth any discontinuities associated with the quantization associated with dispensing locations or droplet size. Some ink jet devices may offer grey scale printing or droplet size modulation to improve filling or boundary region smoothness.

In some embodiments, where mask thickness is less than desired layer thickness, and where multiple overlaid dispensings of material are required to increase the mask thickness, the edge locations of successive levels of dispensing maybe slightly offset from positions associated with previous dispensings in order to give a taper or finer stairstep (i.e. finer than the resolution associated with the layer thickness) to the sidewalls of the mask which may be of use in helping to reduce layer-to-layer discontinuities in the deposited material. Such discontinuity reduction is discussed further in U.S. Provisional patent application Ser. No. 10/830,262, entitled "Methods of Reducing Interlayer Discontinuities Electrochemically Fabricated Three Dimensional Structures", filed Apr. 21, 2004, by Cohen et al.

In some embodiments, as small gaps in the dispensed masks may exist, and where masking material is removed after the selective deposition of a first material, a flash etch (i.e. an etch that removes only a small amount of material) may be employed to clean up any small regions of the first material that are inadvertently deposited prior to proceeding with deposition of second material, or the like.

A ninth embodiment forms a multi-layer three-dimensional structure from a plurality of adhered layers where a single material is electrodeposited and where the dispensed masking material is a conductive material and forms a building material.

The ninth embodiment starts with a metal substrate on to which ink jets, or the like, are used to selectively dispense a layer of conductive material (e.g. solder or a cerro alloy) onto the substrate to form a pattern of the conductive material (i.e. plateaus) through which voids or valleys of non-deposited regions exist. The deposition process may be performed in any orientation (upward, downward, sideways, or in any combination).

If necessary, the dispensed material may be given time to transform. Transformation may occur, for example by application of heat (e.g. via elevated temperature; reduced partial pressure (e.g. application of a vacuum); increased pressure; exposure to radiation such as UVR, IRR, visible light, X-rays, electron beams, and the like; increased pressure; and/or removal of inhibition agents (e.g. the removal of oxygen from a free radical curing system). It may be made to flow by application of heat, or by other techniques to fill in any micro voids in the deposition region that may exist. In some embodiments, drying or solidification may be allowed to occur several times before a completely coated area is obtained. If the deposition height is not at least as great as one layer thickness (LT) the dispensing and transformations may be repeated multiple times to build up the thickness. In this repetition process the transformation operations may not be performed, performed after a selected number of depositions, performed only after the last deposit, or they may be performed after every deposition.

Once the deposition height is at least as great as LT and preferably somewhat greater, a blanket electrodeposition is performed. The blanket deposition fills the valleys to a depth at least as great as LT (preferably somewhat greater or if significantly greater if necessary to get reasonable boundary profiles). The plateaus may also receive the deposition.

Next a planarization operation is used to yield a first layer of the structure that is trimmed to a height that bounds the first layer. The first layer consists of the ink jetted material and the electrodeposited material, each located on different portions of the substrate.

Next, the operations for mask formation (e.g. dispensing, transforming, repeating, and the like), electrodeposition, and planarization are repeated a plurality of times to form a plurality of adhered layers each having a configuration dictated by the data associated with each layer.

After layer formation is complete, one of deposited materials may be removed to yield a released structure of desired material and configuration.

Various alternatives to the ninth embodiment exist. Instead of using only two materials, multiple structural materials may be used (materials that become part of the final structure) and or multiple sacrificial materials may be used. The blanket electrodeposition operations may be replaced by a selective deposition operation or multiple selective deposition operations.

It will be understood by those of skill in the art that additional operations may be used in variations of the first embodiment. These additional operations may, e.g. perform cleaning functions between the primary operations discussed above, they may perform activation functions, monitoring functions, and the like.

FIGS. 19A-19I provide schematic depictions of side views of various stages of a process for forming a multi-layer structure, using an ink jet deposited mask, as applied to a particular three layer structure.

FIG. 19A depicts a substrate 1202 that has been provided.

FIG. 19B depicts an ink jet 1204 dispensing droplets 1206' and 1206" onto the substrate. As indicated in the Figure, a first dispensing location 1208 has received deposits while a number of additional locations 1210 that are to receive masking material have not yet received deposits.

FIG. 19C depicts the state of the process after all locations 1208 and 1210 have received masking material 1212.

FIG. 19D depicts the state of the process after masking material 1212 has been transformed into solidified material 1214.

FIG. 19E depicts the state of the process after an additional deposition of masking material and transformation of that masking material causes an increase in mask height 1216 to a desired level.

FIG. 19F depicts the state of the process after a material 1218 has been electrodeposited into the spaces between transformed masking material 1214 and above that transformed material as well. The height of deposition of material 1218 is such that the minimum deposited height meets or exceeds a layer thickness LT.

FIG. 19G depicts the state of the process after planarization of the first deposited layer of material to a level having a height LT which bounds the first layer.

Figure 19H:
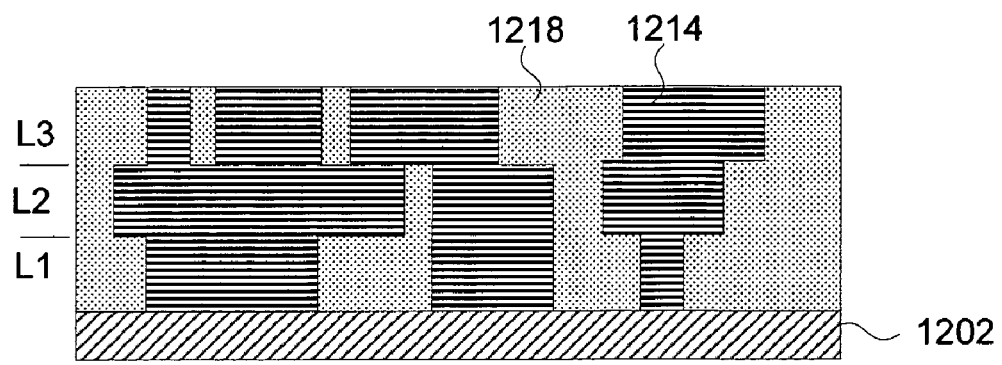
FIGS. 19A-19I provide schematic depictions of side views of various stages of a process for forming a multi-layer structure, using an ink jet deposited mask, as applied to a particular three layer structure.

FIG. 19H depicts the state of the process after repeating the mask forming, the electrodepositing, and planarization operations two additional times such that a total of three layers (L1, L2, and L3) are formed.

Figure 19I:
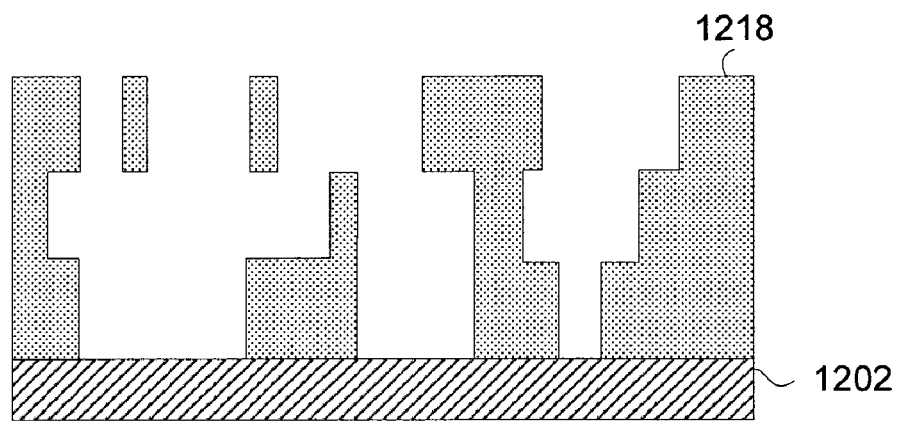

FIG. 19I depicts the state of the process after the masking material has been removed from the electrodeposited material.

Figure 19J:
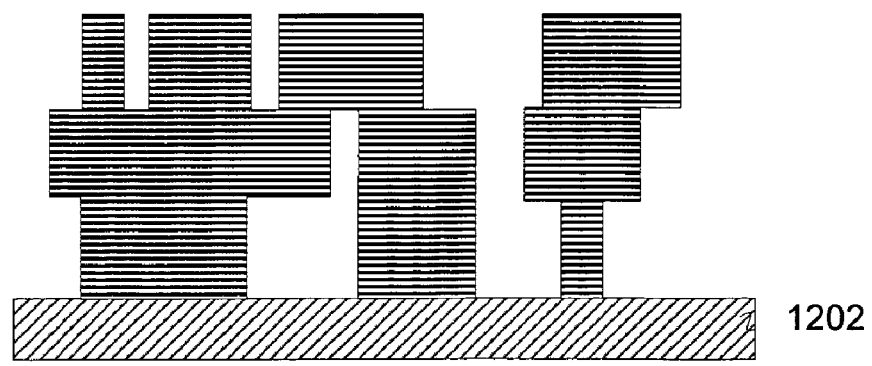

In some alternative embodiments the electro deposited material may have been separated from the masking material whereby the masking material would form the desired structure. This is illustrated in FIG. 19(j). FIG. 19(j) depicts the state of the process after conductive material has been removed to yield a released structure of masking material.

A tenth embodiment forms a multi-layer three-dimensional structure from a plurality of adhered layers where two materials are electrodeposited (both are conductive) and where the dispensed masking material is a dielectric material.

This embodiment include five steps that are repeated a plurality of times in forming a multi-layer structure.

The first operation of the tenth embodiment forms a dielectric mask on a substrate by selectively dispensing droplets of a curable material using an ink jet print head or a modulated stream via an extrusion device.

The second operation includes depositing a first conductive material via electrodeposition, or in some other manner, into voids in the mask.

The third operation removes the mask.

The fourth operation blanket deposits a second conductive material.

The fifth operation planarizes the deposited materials such that the height of the first deposited layer is trimmed to bound the level of the first layer.

Next, the first through fifth operations are repeated one or more times to form a multi-layer structure and finally after layer formation is complete, one of the two conductive materials (the sacrificial material) may be separated from the other conductive material (structural material) to produce the released structure of desired configuration.

In an eleventh embodiment a multi-layer three-dimensional structure is formed from a plurality of adhered layers where one conductive material is electrodeposited, where the dispensed masking material is a dielectric material, and where a second building material is deposited which is also a dielectric. This embodiment includes seven steps that are repeated a plurality of times in forming a multi-layer structure.

The primary operations of this third embodiment include (1) depositing a seed layer, if necessary, and an adhesion layer, if necessary, onto a substrate (i.e. a previously formed layer if present layer is not the first layer) which may be a dielectric, (2) formation of a mask by dispensing a dielectric masking material via ink jet or the like, (3) depositing a first conductive material, e.g. via electrodeposition, into voids in mask, (4) removing the mask, (5) removing the exposed adhesion/seed layer that is exposed between regions of the first conductive material, (6) depositing a second material which is a dielectric by, for example, electrophoretic deposition, spreading spraying, sputtering, and the like, and (7) planarizing the deposited materials to form a first layer of the structure. Next the process repeats operations (1)-(7) a plurality of times to build up a multilayer structure. After all layers are formed, and if desired, one of the first or second materials is separated from the other of the materials to release a structure of desired configuration.

In a twelfth embodiment a multi-layer three-dimensional structure is formed from a plurality of adhered layers where one conductive material is electrodeposited and where the dispensed masking material is a dielectric material which is used as one of the building materials. This embodiment includes four steps that are repeated a plurality of times in forming a multi-layer structure.

The primary operations of this fourth embodiment include (1) forming a mask on the substrate (i.e. a previously formed layer if the present layer is not the first layer) by selectively dispensing a masking material from a ink jet device or by transfer plating or the like to a height greater than or equal to the layer thickness of the present layer, (2) depositing a seed layer into the voids in the mask as well as onto the exposed upper surface of the masking material, (3) depositing a conductive first material to a height equal to or greater than the layer thickness of the present layer (e.g. via an electrodeposition operations) into the voids in the masking material and potentially above the masking material as a result of the seed layer, and (4) planarizing the deposited materials to the height of the present layer, i.e. to bound the present layer, which trims off any excess thickness of the first material and any excess thickness of the mask material as well as the adhesion/seed layer that located above the masking material. Next the process repeats operations (1)-(4) one or more times to form a multi-layer structure that includes two materials per layer one of which is the mask material. The operations result in seed layer material only being located on some portions of the boundary of the conductive first material without any need to use anything other than planarization operation to remove the adhesion/seed layer material. Finally, after layer formation is complete, if desired, one of the materials may be removed to release a structure having the desired configuration or the structure of combined materials may be considered to be the final structure.

FIGS. 20A-20G provide schematic side views of various stages of the process of the twelfth embodiment as applied to the formation of a sample three-dimensional structure.

Figure 20A:
FIGS. 20A-20H provide schematic side views of various stages of the process of the fourth embodiment as applied to the formation of a sample three-dimensional structure.

FIG. 20A depicts a substrate 1322 that is provided on which successive layers of the structure will be formed.

Figure 20B:

FIG. 20B depicts a mask structure 1324 adhered to substrate 1322. The mask structure was formed by ink jetting or extruding a material in a desired pattern or by transfer plating and then transforming that material into a solid.

Figure 20C:
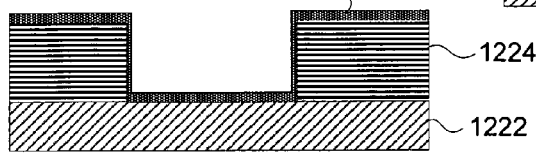

FIG. 20C depicts the state of the process after a seed layer 1326 is formed above mask material 1324 and substrate 1322.

Figure 20D:
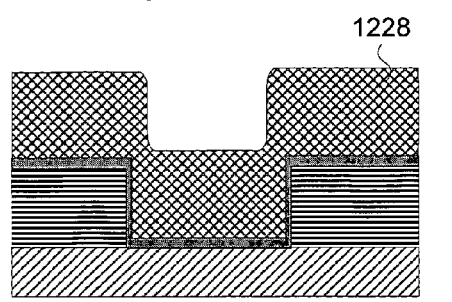
Figure 20E:
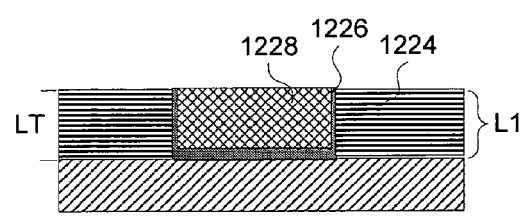

FIG. 20D depicts the state of the process after deposition of a first conductive material 1328, while FIG. 20E depicts the state of the process after planarization of the deposited materials down to a layer thickness LT of the first layer L1.

Figure 20F:
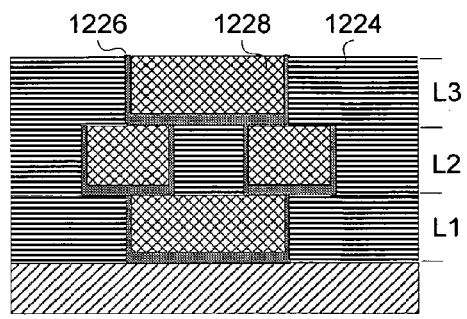

FIG. 20F depicts the state of the process after formation of two additional layers L2 and L3, where each layer includes masking material 1324, conductive material 1328, and seed layer material 1326. The structure of FIG. 20F may be the final structure as it will be used.

Figure 20G:
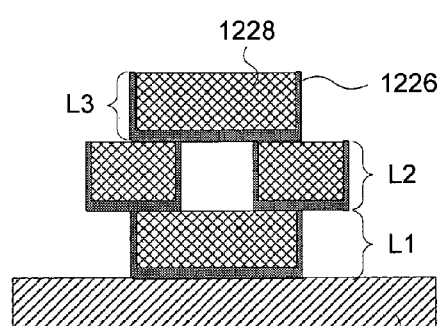
Figure 20H:
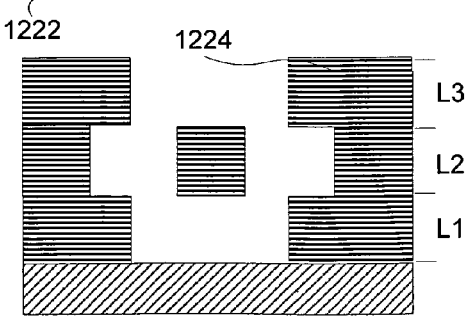

FIG. 20G depicts the state of the process after removal of the masking material which may be considered to be a sacrificial material. As an alternative, FIG. 20H depicts the state of the process after removal of the conductive material which may be considered a sacrificial material.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| US Pat App No, Filing Date US App Pub No, Pub Date | Inventor, Title |
|---|---|
| 09/493,496 - Jan. 28, 2000 | Cohen, "Method For Electrochemical Fabrication" |
| 10/677,556 - Oct. 1, 2003 | Cohen, "Monolithic Structures Including Alignment and/or Retention Fixtures for Accepting Components" |

-continued

| US Pat App No, Filing Date US App Pub No, Pub Date | Inventor, Title |
|---|---|
| 10/830,262 - Apr. 21, 2004 | Cohen, "Methods of Reducing Interlayer Discontinuities in Electrochemically Fabricated Three-Dimensional Structures" |
| 10/271,574 - Oct. 15, 2002 2003-0127336A - Jul. 10, 2003 | Cohen, "Methods of and Apparatus for Making High Aspect Ratio Microelectromechanical Structures" |
| 10/697,597 - Dec. 20, 2002 | Lockard, "EFAB Methods and Apparatus Including Spray Metal or Powder Coating Processes" |
| 10/677,498 - Oct. 1, 2003 | Cohen, "Multi-cell Masks and Methods and Apparatus for Using Such Masks To Form Three-Dimensional Structures" |
| 10/724,513 - Nov. 26, 2003 | Cohen, "Non-Conformable Masks and Methods and Apparatus for Forming Three-Dimensional Structures" |
| 10/607,931 - Jun. 27, 2003 | Brown, "Miniature RF and Microwave Components and Methods for Fabricating Such Components" |
| 10/841,100 - May 7, 2004 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish " |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179A - Dec. 25, 2003 | Bang, "Methods of and Apparatus for Molding Structures Using Sacrificial Metal Patterns" |
| 10/434,103 - May 7, 2004 2004-0020782A - Feb. 5, 2004 | Cohen, "Electrochemically Fabricated Hermetically Sealed Microstructures and Methods of and Apparatus for Producing Such Structures" |
| 10/841,006 - May 7, 2004 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 | Smalley, "Methods of and Apparatus for Electrochemically Fabricating Structures Via Interlaced Layers or Via Selective Etching and Filling of Voids" |
| 10/724,515 - Nov. 26, 2003 | Cohen, "Method for Electrochemically Forming Structures Including Non-Parallel Mating of Contact Masks and Substrates" |
| 10/841,347 - May 7, 2004 | Cohen, "Multi-step Release Method for Electrochemically Fabricated Structures" |
| 60/533,947 - Dec. 31, 2003 | Kumar, "Probe Arrays and Method for Making" |
| 60/534,183 - Dec. 31, 2003 | Cohen, "Method and Apparatus for Maintaining Parallelism of Layers and/or Achieving Desired Thicknesses of Layers During the Electrochemical Fabrication of Structures" |
| 11/029,220 - Jan. 3, 2005 | Frodis, "Method And Apparatus for Maintaining Parallelism of Layers and/or Achieving Desired Thicknesses of Layer During the Electrochemical Fabrication of Structures" |

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may use selective deposition processes or blanket deposition processes on some layers that are not electrodeposition processes. Some embodiments, for example, may use nickel, gold, copper, tin, silver, zinc, solder, various alloys of these and other materials as structural materials while other embodiments may use different materials. Some embodiments, for example, may use copper, tin, zinc, solder or other materials as sacrificial materials. Some embodiments may remove a sacrificial material while other embodiments may not. Some embodiments may use photoresist, polyimide, glass, ceramics, other polymers, and the like as dielectric structural materials. Some embodiments may use, for example, Futurrex Protective Barrier Coating 3-6000, which has a dielectric constant of 2.5 and is curable at 150° C. Some embodiments may use Shipley Intervia™ Photodielectric Materials (such as 8010 and 8021 which are negative photoresists) as structural dielectrics. These materials are available from Shipley Far East Ltd. of Tokyo Japan. Some embodiments, for example may use Shipley BPR 100 Photoresist (which is a negative photoresist) available from Shipley Company of Marlborough, Mass.

In some embodiments, two materials may be deposited in association with individual layers but additional materials may be added to the overall structure by using different pairs of materials on different layers. For example, some layers may include copper and a dielectric while other layers may include nickel and copper. After the formation of the structure is completed, the copper may be removed as a sacrificial material which leaves behind a nickel and dielectric structure with hollowed out regions (i.e. regions where copper was located but removed) and/or a nickel, dielectric, and copper structure if copper is entrapped by regions of nickel and/or dielectric material.

Additional embodiments may, for example, involve applying some of the alternatives discussed in association with the seventh embodiment to the eighth embodiment while other embodiments may involve combinations of the ninth through twelfth embodiments. Other embodiments may be based on combinations of other embodiments discussed in one section of the application with embodiments disclosed in other sections of the application. It will be understood by those of skill in the art that many additional embodiments are possible. For example, in some alternative embodiments additives may be placed in the ink or masking material to harden the surface of the masking material to bring its hardness closer to that of the deposited material or materials which may result in improved planarization results (e.g. less smearing of materials during lapping operations). As another example, some embodiments may use a conductive masking material and replace it on each layer with a different conductive material or with a dielectric material. Some embodiments may etch into one or more of the materials forming some layers in preparation for forming interlacing elements in association with subsequent layers. Some embodiments may use the masks not as deposition masks but instead, or additionally, as etching masks. Some embodiments may not use any planarization processes or may use them on less than all layers or use them a plurality of time during the formation of a single layer. Some embodiments may use multiple structural materials (i.e. materials that become part of the final structure) and or multiple sacrificial materials. It will be understood by those of skill in the art that supplemental operations may be used in conjunction with the various embodiments and alternatives thereto. These supplemental operations, for example may perform cleaning functions between the primary operations, as discussed above, and/or may perform activation functions, other treatment functions, detection and monitoring functions, and the like.

In some embodiments, mesoscale and microscale multilayer three-dimensional structures or devices are electrochemically formed wherein one or more dielectric materials are incorporated into the structure with the formation of each layer. Seed layers, and potentially seed layer stacks of multiple materials (e.g. adhesion layer material and seed layer material), are provided during the formation of layers to ensure that a surface is capable of electrochemically receiving deposits of material. On some layers seed layer material is not deposited as a planar layer but is instead deposited over exposed regions of a substrate and over one or more previously deposited patterns of material on the layer. Additional deposition of material occurs over the seed layer material and planarization operations are used to remove seed layer material deposited on previously deposited materials on the layer.

In some embodiments three-dimensional structures are electrochemically fabricated by depositing a first material onto previously deposited material through voids in a patterned mask where the patterned mask is at least temporarily adhered to a substrate or previously formed layer of material and is formed and patterned onto the substrate via a transfer tool patterned to enable transfer of a desired pattern of precursor masking material. In some embodiments the precursor material is transformed into masking material after transfer to the substrate while in other embodiments the precursor is transformed during or before transfer. In some embodiments layers are formed one on top of another to build up multi-layer structures. In some embodiments the mask material acts as a build material while in other embodiments the mask material is replaced each layer by a different material which may, for example, be conductive or dielectric.

In some embodiments three-dimensional structures are electrochemically fabricated by depositing a first material onto previously deposited material through voids in a patterned mask where the patterned mask is at least temporarily adhered to previously deposited material and is formed and patterned directly from material selectively dispensed from a computer controlled dispensing device (e.g. an ink jet nozzle or array or an extrusion device). In some embodiments layers are formed one on top of another to build up multi-layer structures. In some embodiments the mask material acts as a build material while in other embodiments the mask material is replaced each layer by a different material which may, for example, be conductive or dielectric.

It will be understood by those of skill in the art that additional operations may be used in variations of the above presented embodiments. These additional operations may perform cleaning functions (e.g. between the primary operations discussed above), they may perform activation functions and monitoring functions.

Dispensed masking materials will preferably offer adequate adhesion to the substrate and previously deposited materials onto which they are dispensed. They will preferably be adequately compatible with deposition and/or etching baths as well as deposition and/or plating and/or etching operations that will be employed during the time the masking material is present such that entire layer thicknesses may be deposited and/or sufficient depths etched without need for replacing the mask though in some embodiments such replacement may be acceptable. They are preferably compatible with cleaning solutions and processes as well as activation solutions and processes, and the like. In embodiments where deposition of adhesion layer materials and seed layer materials will be applied to the masking material or the masking material applied thereon, the masking material(s) are preferably sufficiently compatible with such materials. In particular, it is preferable that the masking material(s) need not require use of an adhesion layer material. In some embodiments, preferred masking materials may be dielectrics while in other embodiments masking materials may be conductive materials. In some embodiments structural materials and even sacrificial materials may need to be separable from the masking materials while in other embodiments such ability to separate the material may be unnecessary. Separation may occur by a variety of operations (e.g. heating to melt, chemical dissolution, electrochemical separation, breakdown by radiation exposure, or burning out, and the like. Masking materials once dispensed may become solidified masking materials by a variety of means for curing (e.g. polymerization by UV, visible light, other radiation exposure, or heat), phase change, solvent removal (e.g. evaporation). In still other embodiments, colorants or other additives may be included in the masking materials for a variety of reasons. In other embodiments the materials may be dissolvable by application of certain solvents.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A process for forming a multilayer three-dimensional structure, comprising:
   (a) forming and adhering a layer of material to a substrate, wherein the substrate may include previously formed layers; and
   (b) repeating the forming and adhering operation of (a) a plurality of times to build up a three-dimensional structure from a plurality of adhered layers;
   wherein the formation of at least one layer comprises:
   (i) forming a desired pattern of dielectric material on the substrate or on previously deposited material wherein the patterning of the dielectric results in at least one void in the dielectric material that exposes a portion of the substrate or previously deposited material;
   (ii) applying a seed layer material to the dielectric material;
   (iii) depositing a conductive material into the at least one void in the dielectric; and
   (iv) after depositing the conductive material, removing at least a portion of the seed layer material located on the dielectric material
   (v) selectively etching into the conductive material to form at least one second void;
   (vi) depositing a seed layer into the at least second void; and
   (vii) depositing a second conductive material into the at least one second void.

2. A process for forming a multilayer thee-dimensional structure, comprising:
   (a) forming and adhering a layer of material to a substrate, wherein the substrate may include previously formed layers; and
   (b) repeating the forming and adhering operation of (a) a plurality of times to build up a three-dimensional structure from a plurality of adhered layers;
   wherein the formation of at list one layer comprises;
   (i) forming a desired pattern of a first material on the substrate or on previously deposited material; and thereafter applying a non-planar seed layer material which will be used as based onto which a second material will be subsequently electrodeposited;
   (ii) after deposition of the second material, removing at least portion of the deposition material and a portion of the non-planar seed layer while planarizing a surface of the first and second material,
   (iii) after planarizing, the first or second material is at least partially removed to create voids in preparation for deposition third material,
   (iv) depositing a second seed layer material in the voids created in preparation for deposition of the third material; and
   (v) electrodepositing a third material over wherein the third material is a conductive material that is electrodeposition over the second seed layer material, wherein the third material is a conductive material; and
   (vi) after deposition of the third material, planarizing at least a portion of a least one of first, second, or third materials.

3. The process of claim 2 wherein at least one of the first, second, or third material is a dielectric material comprising at least one of: a photoresist, a polyimide, a glass, a ceramic, a dielectric having a dielectric constant less than about 3.0, Futurrex Protective Barrier Coating 3-6000, Shipley Intervia™ Photodielectric Material 8010, Shipley Intervia™ Photodielectric Material 8021, or Shipley BPR 100 Photoresist.

* * * * *